US010020801B2

(12) United States Patent
Thalheim et al.

(10) Patent No.: US 10,020,801 B2
(45) Date of Patent: Jul. 10, 2018

(54) SWITCH CONTROLLER WITH VALIDATION CIRCUIT FOR IMPROVED NOISE IMMUNITY

(71) Applicant: CT-Concept Technologie GmbH, Biel-Bienne (CH)

(72) Inventors: Jan Thalheim, Biel (CH); Olivier Garcia, Brügg (CH)

(73) Assignee: CT-Concept Technologie GmbH, Biel-Bienne (CH)

( * ) Notice: Subject to any disclaimer, the term of this patent is extended or adjusted under 35 U.S.C. 154(b) by 0 days.

(21) Appl. No.: 15/357,099

(22) Filed: Nov. 21, 2016

(65) Prior Publication Data

US 2017/0070221 A1   Mar. 9, 2017

Related U.S. Application Data

(63) Continuation of application No. 14/743,831, filed on Jun. 18, 2015, now Pat. No. 9,537,382.

(Continued)

(51) Int. Cl.
*H02M 3/335* (2006.01)
*H02M 1/00* (2006.01)
(Continued)

(52) U.S. Cl.
CPC ......... *H03K 17/16* (2013.01); *H01F 27/2823* (2013.01); *H01F 38/14* (2013.01);
(Continued)

(58) Field of Classification Search
CPC ...... H02M 1/44; H02M 1/10; H02M 3/33523; H02M 3/33553; H02M 3/33569; H02M 3/33576
See application file for complete search history.

(56) References Cited

U.S. PATENT DOCUMENTS 3,406,364 A   10/1968   Russell et al.
3,617,854 A   11/1971   Cole
(Continued)

FOREIGN PATENT DOCUMENTS

EP          2515439 A1      10/2012
WO   WO 03/092147 A1   11/2003

OTHER PUBLICATIONS

Huang, C. et al., "Low Jitter and Drift High Voltage IGBT Gate Driver," Pulsed Power Conference, 2003, Dallas, Digest of Technical Papers, PPC-2003, 14th IEEE International, Year: 2003, Volume: 1, pp. 127-130. DOI: 10.1109/PPC.2003.1277675.
(Continued)

*Primary Examiner* — Timothy J Dole
*Assistant Examiner* — Sisay G Tiku
(74) *Attorney, Agent, or Firm* — Christensen O'Connor Johnson Kindness PLLC

(57) ABSTRACT

A switch controller for controlling a power switch includes a signal transformer to galvanically isolate a primary side from a secondary side and receive and transfer a transition signal to transition the power switch to an on or off state between the primary side and the secondary side. The transition signal pulses to a first value to indicate the power switch transitions to the on state, to a second value to indicate the power switch transitions to the off state, and remains at a third value when there is no transition. A transmission circuit is coupled to a primary winding to control a switch to generate the transition signal. The switch switches a substantially low impedance onto the primary winding when there is no transition. A receiver circuit is coupled to a secondary winding to generate a drive signal to control the power switch in response to the transition signal.

26 Claims, 14 Drawing Sheets

Related U.S. Application Data

(60) Provisional application No. 62/020,864, filed on Jul. 3, 2014.

(51) Int. Cl.

| | | |
|---|---|---|
| *H02M 1/10* | (2006.01) |
| *H03K 17/16* | (2006.01) |
| *H01F 27/28* | (2006.01) |
| *H01F 38/14* | (2006.01) |
| *H03K 5/1252* | (2006.01) |
| *H03K 17/61* | (2006.01) |
| *H03K 17/691* | (2006.01) |
| *H04L 25/02* | (2006.01) |
| *H03K 17/56* | (2006.01) |

(52) U.S. Cl.
CPC ......... *H02M 1/00* (2013.01); *H02M 3/33576* (2013.01); *H03K 5/1252* (2013.01); *H03K 17/56* (2013.01); *H03K 17/61* (2013.01); *H03K 17/691* (2013.01); *H04L 25/0266* (2013.01); *H02M 2001/0012* (2013.01)

(56) References Cited

U.S. PATENT DOCUMENTS

| | | | |
|---|---|---|---|
| 3,731,237 A | 5/1973 | Beurrier | |
| 4,027,152 A | 5/1977 | Brown et al. | |
| 4,089,049 A | 5/1978 | Suzuki et al. | |
| 4,121,118 A | 10/1978 | Miyazaki | |
| 5,150,046 A | 9/1992 | Lim | |
| 5,563,536 A | 10/1996 | Hosl et al. | |
| 5,684,683 A * | 11/1997 | Divan | H02M 3/285 363/132 |
| 6,262,600 B1 | 7/2001 | Haigh et al. | |
| RE38,082 E | 4/2003 | Vlahu | |
| 7,072,191 B2 | 7/2006 | Nakao et al. | |
| 8,536,799 B1 | 9/2013 | Grisamore et al. | |
| 8,634,480 B2 * | 1/2014 | Nuebling | H04B 1/1607 375/258 |
| 9,024,541 B2 | 5/2015 | Xie et al. | |
| 9,065,429 B2 | 6/2015 | Blanken et al. | |
| 9,313,840 B2 | 4/2016 | Grisamore et al. | |
| 2003/0151442 A1 * | 8/2003 | Strzalkowski | H03K 5/08 327/300 |
| 2010/0329364 A1 | 12/2010 | Giombanco et al. | |
| 2011/0063877 A1 * | 3/2011 | Yang | H02M 3/33592 363/21.06 |
| 2012/0032708 A1 * | 2/2012 | Coleman | H02M 3/158 327/109 |
| 2012/0081177 A1 * | 4/2012 | Nuebling | H04B 1/1607 327/590 |
| 2012/0300520 A1 * | 11/2012 | Ren | H02M 3/33592 363/127 |
| 2013/0088897 A1 * | 4/2013 | Adragna | H02M 3/33507 363/21.12 |
| 2015/0103567 A1 * | 4/2015 | Wang | H02M 3/33592 363/21.13 |
| 2015/0280573 A1 * | 10/2015 | Gong | H02M 3/33523 363/21.14 |
| 2016/0006337 A1 | 1/2016 | Thalheim et al. | |

OTHER PUBLICATIONS

Thalheim, J., "Chipset for Flexible and Scalable High-Performance Gate Drivers For 1200 V-6500 V IGBTs," Proceedings of the 20th International Symposium on Power Semiconductor Devices & IC's, May 18-22, 2008, Orlando, © 2008 IEEE, pp. 197-200.

Pawel, S. et al., "1700V Fully Coreless Gate Driver with Rugged Signal Interface and Switching-Independent Power Supply," Proceedings of the 20th International Symposium on Power Semiconductor Devices & IC's, May 18-22, 2008, Orlando, © 2008 IEEE, pp. 319-322.

Krapp, J., "EMC Challenges in IGBT Driver Electronics," International Exhibition & Conference for Power Electronics, Intelligent Motion and Power Quality 2011 (PCIM Asia 2011), Shanghai, China, Jun. 21-23, 2011, 5 pages [Copy retreived Oct. 22, 2015 from: http://igbt.p-e-china.com/neir.asp?newsid=4665].

International Application No. PCT/EP2015/065253—PCT International Search Report & Written Opinion, dated Sep. 7, 2015, 10 pages.

PRC (China) Application No. 201580032188.0—Office Action with English Translation dated Dec. 12, 2017, 20 pages.

European Patent Application No. 15 733 763.5—European Office Action dated Mar. 26, 2018, 5 pages.

* cited by examiner

SWITCH CONTROLLER WITH VALIDATION CIRCUIT FOR IMPROVED NOISE IMMUNITY

CROSS-REFERENCE TO RELATED APPLICATION

This application is a continuation of U.S. patent application Ser. No. 14/743,831, filed on Jun. 18, 2015, now pending, which claims the benefit of U.S. Provisional Application No. 62/020,864, filed Jul. 3, 2014, entitled "SWITCH CONTROLLER WITH VALIDATION CIRCUIT FOR IMPROVED NOISE IMMUNITY." U.S. patent application Ser. No. 14/743,831 and 62/020,864 are hereby incorporated by reference.

TECHNICAL FIELD

The present invention relates to a control circuit for a semiconductor switch, a system having a control circuit for a semiconductor switch and at least one semiconductor switch, and a method for generating a control signal for a semiconductor switch.

BACKGROUND

In control circuits for semiconductor switches, in particular in control circuits for power semiconductor switches, a primary side and a secondary side can be galvanically isolated by means of an isolating transformer. That can protect the circuits at the primary side from the potentially high switched voltages on the secondary side. However, in such systems and in some situations, changes in potential at the semiconductor switch as a result of parasitic coupling capacitances, in particular coupling capacitances of the isolating transformer, can generate a current between the primary side and the secondary side via the isolating transformer. That can lead to the occurrence of interference signals which may be erroneously identified as control signals or may result in that the correct control signals are not identified. As a consequence, the semiconductor switch may be switched on or off in an undesired manner. A reduction of the coupling capacitance of the transformer has been proposed to alleviate this problem. That can be achieved in some examples by providing a capacitive shielding or the largest possible distance between a primary winding and a secondary winding of an isolating transformer.

SUMMARY OF THE INVENTION

A first control circuit for a semiconductor switch comprises a primary side having a circuit designed to generate control signals for switching a semiconductor switch, a secondary side comprising a driver circuit designed to switch a semiconductor switch in response to the control signals, and an isolating transformer arranged between the primary side and the secondary side, said isolating transformer galvanically isolates the primary side and the secondary side and is designed to transfer the control signals from the primary side to the secondary side, wherein the isolating transformer comprises at least one primary-side winding electrically connected to the circuit on the primary side and at least one secondary-side winding electrically connected to the driver circuit on the secondary side, wherein the primary-side winding is arranged such that it at least partly shields the secondary-side winding from external alternating magnetic fields or at least partly compensates for magnetic fluxes generated by the external alternating magnetic fields, wherein the secondary side furthermore comprises a validation circuit designed to validate the control signals received on the secondary side, wherein the validation circuit comprises a comparison circuit, which compares the control signals received on the secondary side with a threshold voltage, and a circuit for generating a validation signal in response to an output of the comparison circuit, wherein the validation circuit is further designed to declare a control signal received on the secondary side to be valid if the validation signal exceeds a first predetermined threshold value in a predetermined time period, and wherein the driver circuit on the secondary side is designed to switch the semiconductor switch if a control signal received on the secondary side is declared to be valid.

The first control circuit comprises an isolating transformer, which lessens the influence of another disturbance source in addition to the coupling capacitance between the primary and secondary sides. As a result of parasitic inductive coupling, a change in a current of the semiconductor switch can reflect back to the control circuit and generate interference signals. In some known solutions, disturbance due to the change in current through the semiconductor switch is of negligible importance as the control circuit is arranged at some distance from the controlled semiconductor switches and as such the disturbance as a result of parasitic inductive coupling is low, or specific shielding devices are provided to reduce the disturbance effects of parasitic inductive coupling. The transformer of the first control circuit can reduce the influence of the disturbance due to the change in the output current of the semiconductor switch as a result of a skilful arrangement of the primary-side and secondary-side windings. This arrangement can adequately perform this function even in situations in which the control circuit is arranged near a semiconductor switch (in which high currents are switched under certain circumstances). However, as a result of the arrangement of the first and second windings in the transformer of the first or second control circuits (to reduce the disturbance due to the change in the output current), a coupling capacitance between the primary and secondary windings can be increased in comparison with transformers in which the first and second windings are spatially isolated from each other to a greater extent. Moreover, in some examples, the shielding effect of the primary winding in a specific time period around an edge of a pulsed control signal (the signal is transitioning between logic high and low values) may be less effective than in time periods in which the control signal is substantially in a steady state (the signal is substantially logic high or logic low). That can in turn lead to inductive disturbances as a result of the change in the current through the semiconductor switch. In some examples, disturbances occurring as a result of the increased coupling capacitance and the inductive coupling can result in changes in a signal level of a control signal received by the secondary side. As a result, a secondary-side driver circuit may incorrectly switch the semiconductor switch even if no valid control signal is present or a valid control signal may be corrupted to such an extent that the semiconductor switch is not switched. The validation circuit of the first control circuit can reduce the sensitivity of the control circuit towards the disturbances just described by converting a received control signal into a validation signal and using the latter for determining the validity of the received control signal. In this way, for example, a control signal that has decomposed into a plurality of pulsed sections as a result of disturbances (inductive or capacitive) can be identified as a valid control signal. In other cases, disturbances of opposite polarity that are superposed on control signals can be suppressed.

A second control circuit for a semiconductor switch comprises a primary side having a circuit designed to generate pulsed control signals for switching a semiconductor switch, a secondary side comprising a driver circuit designed to switch a semiconductor switch in response to the pulsed control signals, and an isolating transformer arranged between the primary side and the secondary side, said isolating transformer galvanically isolates the primary side and the secondary side and is designed to transfer the pulsed control signals from the primary side to the secondary side, wherein the isolating transformer comprises at least one primary winding (which may also be referred to as a primary-side winding) electrically connected to the circuit on the primary side and a secondary winding (which may also be referred to as a secondary-side winding) electrically connected to the driver circuit on the secondary side, wherein the primary winding is arranged such that it at least partly shields the secondary winding from external alternating magnetic fields or at least partly compensates for magnetic fluxes generated by external alternating magnetic fields, wherein a pulse length of the pulsed control signals generated on the primary side is shorter than 100 ns.

The disturbances, described in detail above, as a result of increased capacitive coupling and disturbances as a result of the changes in the current through the semiconductor switch to the control circuit can occur in the second control circuit as well. Shortening the pulsed control signals can have the effect that a switching activity (switching between an ON state from an OFF state, or vice versa) of the semiconductor switch (and an associated change in the current through the semiconductor switch and the voltage across the semiconductor switch) substantially commences only after the end of the control pulse. As already described, a shielding or compensation effect of the primary winding can be more effective in this region than during a time period of an edge of the control pulses (a transition from a logic high to logic low value or vice versa). An improved shielding effect of the primary winding can thus be utilized in this time range. In addition, with the use of shorter pulses, a main inductance of the transformer can be reduced, which in turn can reduce the parasitic coupling capacitances and can thus reduce the influence of the voltage changes across the semiconductor switch. In a first embodiment, a switch controller includes a primary side comprising signal transmission circuitry to transmit signals representative of a desired transition of a switch between an on state and an off state or between an off state and an on state, the signals having a signal duration and a secondary side isolated from the primary side. The secondary side further signal reception circuitry to receive the signals representative of the desired transition and a drive signal generator to generate a drive signal in response to and in accordance with valid signals received by the signal reception circuitry. The switch controller further includes a signal transformer galvanically isolating the primary side from the secondary side but inductively coupling the signal transmission circuitry to the signal reception circuitry, the signal transformer having a primary side winding coupled to the signal transmission circuitry and a secondary side winding coupled to the signal reception circuitry and a switch coupled to switch a relatively low impedance onto the primary side winding during pauses between transmissions of the signals representative of the desired transition of the switch. The secondary side signal reception circuitry further comprises a validation circuit to validate signals received by the signal reception circuitry, the validation circuit comprising a first comparator to compare a magnitude of the signals received by the signal reception circuitry with a magnitude threshold, a timer to time a duration that the magnitude of the signals received by the signal reception circuitry exceeds the magnitude threshold, and a second comparator to compare the timed duration with a threshold duration and, in response to the timed duration exceeding the threshold duration, output to the drive signal generator signals indicative of the validity of particular signals received by the signal reception circuitry, wherein the threshold duration is less than the signal duration.

This switch controller can have one or more of the following features. For example, the threshold duration is greater than 20% of the signal duration. As another example, threshold duration is greater than 40% of the signal duration. Further, the signal duration minus the threshold duration is less than 100 nanoseconds. As another example, the signal duration minus the threshold duration is less than 50 nanoseconds. In a further example, the signal duration minus the threshold duration is less than 30 nanoseconds.

In a second embodiment, the switch controller comprises a primary side comprising signal transmission circuitry to transmit signals representative of a desired driving of a power switch and a secondary side isolated from the primary side. The secondary side further includes signal reception circuitry to receive the signals representative of the desired driving and a drive signal generator to generate a drive signal in response to and in accordance with valid signals received by the signal reception circuitry. The second embodiment of the switch controller further includes a signal transformer galvanically isolating the primary side from the secondary side but inductively coupling the signal transmission circuitry to the signal reception circuitry. The secondary side signal reception circuitry further comprises a validation circuit to validate signals received by the signal reception circuitry, the validation circuit comprising a validation comparator to compare a parameter of the signals received by the signal reception circuitry with a validation criterion, a timer to time a duration within a measurement period of time that the parameter of the signals received by the signal reception circuitry satisfies the validation criterion, and a second comparator to compare the timed duration with a threshold duration and, in response to the timed duration exceeding the threshold duration, output to the drive signal generator signals indicative of the validity of particular signals received by the signal reception circuitry, wherein the measurement period is less than 80 nanoseconds greater than the threshold duration.

This switch controller can have one or more of the following features. For example, the validation comparator is a first comparator to compare a magnitude of the signals received by the signal reception circuitry with a magnitude threshold and the timer is to time a duration within the measurement period of time that the magnitude of the signals received by the signal reception circuitry exceeds the magnitude threshold. Further, the measurement period is less than 60 nanoseconds greater than the threshold duration. Or for example, the measurement period is less than 30 nanoseconds greater than the threshold duration. Also, the power switch comprises an insulated gate bipolar transistor to transition between an off and on states in a time greater than 100 nanoseconds. Or further, the power switch comprises an insulated gate bipolar transistor to transition between an off and on states in a transition time, the transition time being greater than the measurement period of time.

In a third embodiment, the switch controller for at least one power switch of a plurality of power switches that are to transition between off/on states and between on/off states over an average transition time, the switch controller includes a primary side comprising signal transmission circuitry to transmit signals representative of a desired driving of the at least one power switch and a secondary side isolated from the primary side. The secondary side comprises signal reception circuitry to receive the signals representative of the desired driving and a drive signal generator to generate a drive signal in response to and in accordance with valid signals received by the signal reception circuitry. The third embodiment of the switch controller includes a signal transformer galvanically isolating the primary side from the secondary side but inductively coupling the signal transmission circuitry to the signal reception circuitry wherein the secondary side signal reception circuitry further comprises a validation circuit to validate signals received by the signal reception circuitry. The validation circuit includes a validation comparator to compare a parameter of the signals received by the signal reception circuitry with a validation criterion, a timer to time a duration within a measurement period of time that the parameter of the signals received by the signal reception circuitry satisfies the validation criterion, wherein the measurement period of time is shorter than the average transition time of the power switch, and a second comparator to compare the timed duration with a threshold duration and, in response to the timed duration exceeding the threshold duration, output to the drive signal generator signals indicative of the validity of particular signals received by the signal reception circuitry.

This switch controller can have one or more of the following features. For example, the validation comparator is a first comparator to compare a magnitude of the signals received by the signal reception circuitry with a magnitude threshold and the timer is to time a duration within the measurement period of time that the magnitude of the signals received by the signal reception circuitry exceeds the magnitude threshold. Or for example, the average transition time is between 100 and 1000 nanoseconds.

The first, second, and third embodiment of the switch controller and their one or more respective features can also include the following features. Such as the measurement period is less than 40 nanoseconds greater than the threshold duration. For example, the measurement period is less than 30 nanoseconds greater than the threshold duration. Further, the timer includes a capacitor, a current source to charge the capacitor during the measurement period of time when the magnitude of the signals received by the signal reception circuitry exceeds the magnitude threshold, and a current sink to discharge the capacitor during the measurement period of time when the magnitude of the signals received by the signal reception circuitry does not exceed the magnitude threshold. For example, the threshold duration is between 20% and 60% of a duration of a signal indicating that a transition of the switch between an on state and an off state or between an off state and an on state is desired. Or further, the threshold duration is between 30% and 50% of a duration of a signal indicating that a transition of the switch between an on state and an off state or between an off state and an on state is desired. Also, a primary side signal winding and a secondary side signal winding wound around the signal transformer, wherein the secondary side signal winding partially or fully covers the primary side signal winding. In another example, a switch coupled to switch a relatively low impedance onto the primary side winding during pauses between transmissions of the signals representative of the desired transition of the switch. Further, the relatively low impedance is a resistor having a resistance of less than 90, less than 50, less than 20, or less than 10Ohms. Or the relatively low impedance is a short circuit. Also, the relatively low impedance is a voltage source $V_{DD}$ 199 blocked by a bypass capacitor 197. In addition, the relatively low impedance is a capacitor 198 in series with the winding. For example, the validation circuit includes on-signal validation circuitry to validate an on-signal received by the signal reception circuitry and off signal validation circuitry to validate an off-signal received by the signal reception circuitry. Further, the on-signal validation circuitry includes the first comparator, the timer, and the second comparator; and the off-signal validation circuitry further includes a third comparator to compare the magnitude of the signals received by the signal reception circuitry with a third comparator magnitude threshold, a second timer to time a second duration within a second period of time that the magnitude of the signals received by the signal reception circuitry exceeds the third comparator magnitude threshold, and a fourth comparator to compare the timed second duration with a second threshold duration and, in response to the second timed duration exceeding the second threshold duration, output to the drive signal generator a signal indicative of the validity of off-signals received by the signal reception circuitry. Further, the third comparator magnitude threshold differs from the magnitude threshold. Also, one of the third comparator magnitude threshold and the magnitude threshold is a positive threshold; and the other of the third comparator magnitude threshold and the magnitude threshold is a negative threshold. In addition, the timer is to time the duration within the measurement period of time that the magnitude of the signals received by the signal reception circuitry is below a negative magnitude threshold or above a positive magnitude threshold. Or further, the signals representative of the desired driving each comprises a voltage pulse having a magnitude selected based on a turns ratio of the signal transformer to cause, in the absence of noise, reception of a pulse having a magnitude exceeding the magnitude threshold at the signal reception circuitry. For example, the measurement period of time is less than 100 ns. Also, the measurement period of time is less than 90 ns.

In a fourth embodiment, a switch controller for use with an IGBT switch includes a driver interface coupled to receive a system input signal and output a plurality of drive signals in response to the system input signal, wherein the system input signal provides information for controlling a power switch, a plurality of switches coupled to receive the plurality of drive signals from the driver interface, a signal transfer element coupled to the plurality of switches, wherein the plurality of switches are controlled such that a primary side voltage of a first winding of the signal transfer element may transition to a positive voltage (+VDD) for a first time period in response to the system input signal in a first state and the primary side voltage may transition to a negative voltage (−VDD) for the first time period in response to the system input signal in a second state, wherein the primary side voltage is substantially zero otherwise, and a drive circuit, coupled to receive a secondary side voltage from a secondary winding. The drive circuit further includes a validation circuit coupled to receive the secondary side voltage, wherein the validation circuit integrates the secondary side voltage to produce an first-state signal and an second-state signal; and a state circuit coupled to receive the first state signal and the second state signal and output the power switch drive signal, wherein the power switch drive signal is coupled to control the power switch between a first state and a second state.

This switch controller can have one or more of the following features. For example, the signal transfer element further comprises the first winding and the second winding wound around a magnetic core in such a way that the primary winding compensates for external magnetic fields on the secondary winding when the primary winding is short circuited. Or further, the signal transfer element further comprises the first winding and the second winding interleaved around a magnetic core. In another example, the signal transfer element further comprises the first winding and the second winding wound around a magnetic core, wherein the first winding and the second winding are substantially adjacent. Also, the signal transfer element further comprises the first winding and the second winding wound around a magnetic core, wherein the first winding and the second winding are substantially adjacent. In addition, the signal transfer element further comprises the first winding and the second winding wound around a magnetic core, wherein the first winding substantially covers the second winding. For example, the signal transfer element further comprises insulation between the first winding and the second winding. In addition, the system input signal transitions between the first state and the second state, wherein the system input signal is in the first state for a second time period, wherein the second time period is greater than the first time period. Also, the plurality of switches further include a first switch coupled to receive a first drive signal in response to the system input signal, wherein the first switch is ON for the first time period in response to the system input signal transitioning to the first state, a second switch coupled to receive a second drive signal in response to the system input signal, wherein the second switch is OFF for the first time period in response to the system input signal transitioning to the first state a third switch coupled to receive a third drive signal in response to the system input signal, wherein the third switch is ON for the first time period in time in response to the system input signal transitioning to the second state, and a fourth switch coupled to receive a fourth drive signal in response to the system input signal, wherein fourth switch is OFF for the first time period in response to the system input signal transitioning to the second state. In addition, a first end of the primary winding is coupled between the first switch and the second switch and a second end of the primary winding is coupled between the third switch and the fourth switch. Also, the validation circuit further includes a first ramp generator coupled to generate a first ramp signal in response to the secondary side voltage and a comparator coupled to receive the first ramp signal and a ramp threshold, wherein the comparator compares the first ramp signal to the ramp threshold to generate the first state signal. For example, the validation circuit further comprises a control signal generator coupled to receive the secondary side voltage, wherein the control signal generator generates a first control signal in response to secondary side voltage and the first ramp signal is generated in response to the first control signal. Also, the control signal generator further comprises a comparator coupled to receive the secondary side voltage and a first threshold, wherein the comparator compares the secondary side voltage to the first threshold to generate the first control signal. In addition, the ramp generator further comprises a first capacitance, wherein the first capacitance is charged and discharged in response to the secondary side voltage to produce the first ramp signal, wherein a rate of charging the first capacitance is greater than a rate of discharging the first capacitance. In some cases, the rate of charge may be three times greater than the rate of discharge. Also, the ramp generator further discharges the first capacitance to substantially zero in response to the power switch drive signal. For example, the validation circuit further includes a second ramp generator coupled to generate a second ramp signal in response to the secondary side voltage and a comparator coupled to receive the second ramp signal and a ramp threshold, wherein the comparator compares the second ramp signal to the ramp threshold to generate the second state signal. As another example, the validation circuit further comprises a control signal generator coupled to receive the secondary side voltage, wherein the control signal generator generates a second control signal in response to secondary side voltage and the second ramp signal is generated in response to the second control signal. Also, the control signal generator further comprises a comparator coupled to receive the secondary side voltage and a second threshold, wherein the comparator compares the secondary side voltage to second threshold to generate the second control signal. Further, the ramp generator further comprises a second capacitance, wherein the second capacitance is charged and discharged in response to the secondary side voltage to produce the second ramp signal, wherein the rate of charging the second capacitance is greater than a rate of discharging the second capacitance. For example, the ramp generator further discharges the second capacitance to substantially zero in response to the power switch drive signal. Also, the ramp generator further comprises a first capacitance and a second capacitance, wherein the first capacitance and the second capacitance is discharged in response to the secondary side voltage, a first control signal, and a second control signal, wherein the first control signal is generated in response to the secondary side voltage and a first threshold and the second control signal is generated in response to the secondary side voltage and a second threshold. In some cases, the drive circuit further includes a latch, wherein the latch is coupled to output the power switch drive signal and is set in response to the first state signal and reset in response to the second state signal.

In a fifth embodiment, a drive circuit for use with an IGBT switch controller includes a validation circuit coupled to receive a secondary signal from a secondary winding of an energy transfer element, wherein the secondary signal provides information to control the turn on and turn off a power switch, wherein the validation circuit further integrates the secondary signal to produce an first-state signal and an second-state signal. The validation circuit further includes a first control signal generator coupled to receive the secondary signal and output a first control signal, wherein the first control signal is in a first state when the secondary signal is greater than a first threshold and in a second state when the secondary signal is less than a first threshold, a first ramp generator coupled to generate a first ramp signal in response to the first control signal, wherein the first ramp signal increases when the first control signal is in the first state and decreases when the first ramp signal in the second state, a comparator coupled to receive the first ramp signal and a ramp threshold, wherein the comparator outputs the first state signal in response to the comparison between the first ramp signal and the ramp threshold, and a state circuit coupled to receive the first state signal and the second state signal, wherein the state circuit outputs a power switch drive signal for controlling the turn on and turn off the power switch in response to the first state signal and the second state signal.

This drive circuit can have one or more of the following features. For example, the validation circuit further includes a second control signal generator coupled to receive the secondary signal and output a second control signal, wherein the second control signal is in the first state when the secondary signal is greater than a second threshold and in the second state when the secondary signal is less than the second threshold, a second ramp generator coupled to generate a second ramp signal in response to the second control signal, wherein the second ramp signal increases when the first control signal is in the first state and decreases when the second ramp signal in the second state, and a comparator coupled to receive the second ramp signal and the ramp threshold, wherein the comparator outputs the second signal in response to the comparison between the second ramp signal and the ramp threshold. In a further example, the drive circuit turns on the power switch in response to the first state signal and turns off the power switch in response to the second state signal. Also, the energy transfer element further comprises a primary winding and the secondary winding wound around a magnetic core in such a way that the primary winding compensates for external magnetic fields on the secondary winding when the primary winding is short circuited.

In a sixth embodiment, a control circuit for a semiconductor switch further includes a primary side having a circuit designed to generate control signals for switching a semiconductor switch, a secondary side comprising a driver circuit designed to switch a semiconductor switch in response to the control signals, and an isolating transformer arranged between the primary side and the secondary side, said isolating transformer galvanically isolating the primary side and the secondary side and being designed to transfer the control signals from the primary side to the secondary side, wherein the isolating transformer comprises at least one primary winding electrically connected to the circuit on the primary side and a secondary winding electrically connected to the driver circuit on the secondary side, wherein the primary winding is arranged such that it at least partly shields the secondary winding from external alternating magnetic fields or at least partly compensates for magnetic fluxes generated by external alternating magnetic fields. The secondary side further includes a validation circuit designed to validate a validity of control signals received on the secondary side. The validation circuit further includes a comparison circuit, which compares control signals received on the secondary side with a threshold voltage, a circuit for generating a validation signal in response to an output of the comparison circuit wherein the validation circuit is further designed to declare a control signal received on the secondary side to be valid if the validation signal exceeds a first predetermined threshold value, and the driver circuit on the secondary side is designed to switch the semiconductor switch if a control signal received on the secondary side is declared to be valid.

This control circuit can have one or more of the following features. For example, the comparison circuit includes a first comparator, which compares control signals received on the secondary side with a first threshold voltage and a second comparator, which compares control signals received on the secondary side with a second threshold voltage. In a further example, the validation signal comprises a first validation signal and a second validation signal. Also, the semiconductor switch is switched on if the validation signal exceeds the predetermined threshold value, and wherein the semiconductor switch is switched off if the validation signal exceeds a second predetermined threshold value. In some cases, the first and second threshold values are identical. Further, the first, the second or both predetermined threshold values are minimum durations. For example, the first, the second or both predetermined threshold values are signal level threshold values. Or for example, the validation circuit is designed to determine a pulse length of the validation signal and to determine the validity of the control signal received on the secondary side on the basis of whether the pulse length of the validation signal is longer than a predetermined pulse length threshold value. Also, the validation circuit is designed to compare a signal level of the validation signal with a predetermined signal level threshold value and to determine the validity of the control signal received on the secondary side on the basis of whether the signal level of the validation signal exceeds the predetermined signal level threshold value in a predetermined time. In some cases, the validation circuit is designed to determine the validity of the pulsed control signal on the basis of whether the signal level of the validation signal exceeds the predetermined signal level threshold value for a predetermined duration. Further, the circuit for generating a validation signal comprises an integration circuit for generating the validation signal. For example, the integration circuit is designed to charge or discharge a capacitance in response to an output of the comparison circuit, for generating the validation signal. Also, the integration circuit is designed to charge or discharge a capacitance in response to an output of the comparison circuit, for generating the validation signal. In a further example, the integration circuit is further designed to discharge a capacitance in response to a switching signal of the semiconductor switch, for generating the validation signal. Further, the integration circuit is further designed to discharge a capacitance in response to a switching signal of the semiconductor switch, for generating the validation signal. For example, integration circuit is designed to increase an absolute value of a signal level of the validation signal at a first rate if a level of the pulsed control signal received on the secondary winding is above the threshold voltage. In a further example, the integration circuit is designed to reduce an absolute value of a signal level of the validation signal at a second rate if a level of the pulsed control signal received on the secondary winding is below the threshold voltage. Also, the first rate is greater than the second rate. Further, the integration circuit comprises one or a plurality of current sources arranged to charge or discharge a capacitance of the integration circuit in response to an output of the comparison circuit, for generating the validation signal. In another example, the integration circuit includes a first integration circuit designed to increase a level of a first validation signal if the control signals received on the secondary side are above the first threshold voltage, and designed to reduce the level of the first validation signal if the control signals received on the secondary side are below the first threshold voltage, and a second integration circuit designed to increase a level of a second validation signal if the control signals received on the secondary side are above a second threshold voltage, and designed to reduce the level of the second validation signal if the control signals received on the secondary side are below the first threshold voltage. Also, the circuit for generating a validation signal comprises a filter circuit for generating the validation signal. For example, generating a validation signal comprises reconstructing primary-side control signals. In a further example, the validation circuit is designed to filter interference signals from received control signals in a predetermined range around positive or negative edges of the control signals received on the secondary winding. In some cases, the driver circuit is designed to receive an output signal of the validation circuit and further signals and to switch the semiconductor switch on the basis of the output signal of the validation circuit and the further signals. Also, one of the further signals is a control signal received on the secondary winding. Further, the isolating transformer has a transformer core and the primary and secondary windings are wound onto the transformer core such that they at least partly overlap. For example, the primary winding completely covers the second winding. In another example, the transformer core defines a closed form having a cutout, and wherein the primary and secondary windings sweep over in each case at most 120° or in each case at most 60° of a circumference of the closed form. Further, the secondary winding has a smaller diameter than the primary winding. Also, the first and secondary windings are wound at least partly in a bifilar arrangement. For example, a coupling capacitance between the primary side and the secondary side is greater than 6 pF. In a further example, a main inductance of the transformer is less than 100 µH. Also, the primary winding substantially shields the secondary winding from alternating magnetic fields. In some cases, the isolating transformer is a planar transformer. For example, the control circuit is designed to short-circuit the primary winding of the transformer at times. Further, short-circuiting comprises the fact that an impedance between a first connection and a second connection of the first winding is less than 20 □0. Also, the control circuit is designed to short-circuit the primary winding of the transformer if no control signals are transferred. In addition, the control circuit is designed to short-circuit the primary winding of the transformer if the control signal has a static signal level. For example, the control circuit comprises two or more switches designed to short-circuit the primary winding. Also, the two or more switches are arranged such that they connect a first and a second connection of the first turn to a reference potential if the switches are closed. Further, a voltage drop across the switches for a current of 100 mA is less than 4 V. In some cases, the switches are furthermore designed to generate pulsed control signals on the first winding. For example, the pulsed control signals have a first polarity if the semiconductor switch is intended to be switched on, and have a second polarity, opposite to the first polarity, if the semiconductor switch is intended to be switched off. In another example, disturbances are superposed on the control signal in the secondary winding as a result of capacitive coupling of an output voltage of the semiconductor switch or of others in a system for providing energy, such that a signal level of control signals received on the secondary side is corrupted at times. Further, the control signal in the secondary winding decomposes into a plurality of pulsed sections at least partly as a result of the disturbances as a result of capacitive coupling of an output voltage of the semiconductor switch. Also, the disturbances comprise oscillating disturbances. In some cases, the disturbances occur in a range of 15 ns around an edge of the pulsed control signal. In another example, an influence of the disturbances on a switching sequence of the semiconductor switch is suppressed in the validation signal. Further, a pulse length of the pulsed control signals generated on the primary side is shorter than 100 ns.

In a seventh embodiment, a system includes at least one semiconductor switch and the sixth embodiment of the control circuit according to any of one or more of the features discussed for controlling the semiconductor switch. This system can also include one or more of the following features. For example, the semiconductor switch is a power semiconductor switch. Also, the semiconductor switch is an IGBT. Further, the system comprises two or more semiconductor switches. In another example, the control circuit is arranged at a distance of less than 10 cm from the semiconductor switch.

In an eight embodiment, a method for generating a control signal for a semiconductor switch includes generating a control signal for switching a semiconductor switch, transferring the control signal from a primary side to a secondary side of a circuit by means of a transformer having a primary winding and a secondary winding, wherein the primary winding is arranged such that it at least partly shields the secondary winding from external alternating magnetic fields or at least partly compensates for magnetic fluxes generated by external alternating magnetic fields, comparing control signals received on the secondary side with a threshold voltage, generating a validation signal in response to comparing control signals received on the secondary side with a threshold voltage, declaring a control signal received on the secondary side to be valid if the validation signal exceeds a first predetermined threshold value, and switching the semiconductor switch if the control signal received on the secondary side is valid.

In a ninth embodiment, a control circuit for a semiconductor switch includes a primary side having a circuit designed to generate pulsed control signals for switching a semiconductor switch, a secondary side comprising a driver circuit designed to switch a semiconductor switch in response to the pulsed control signals, an isolating transformer arranged between the primary side and the secondary side, said isolating transformer galvanically isolating the primary side and the secondary side and being designed to transfer the pulsed control signals from the primary side to the secondary side, wherein the isolating transformer comprises at least one primary winding electrically connected to the circuit on the primary side and a secondary winding electrically connected to the driver circuit on the secondary side, wherein the primary winding is arranged such that it at least partly shields the secondary winding from external alternating magnetic fields or at least partly compensates for magnetic fluxes generated by external alternating magnetic fields, wherein a pulse length of the pulsed control signals generated on the primary side is shorter than 100 ns.

BRIEF DESCRIPTION OF THE FIGURES

Non-limiting and non-exhaustive embodiments of the present invention are described with reference to the following figures, wherein like reference numerals refer to like parts throughout the various views unless otherwise specified.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention. Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Figure 1:
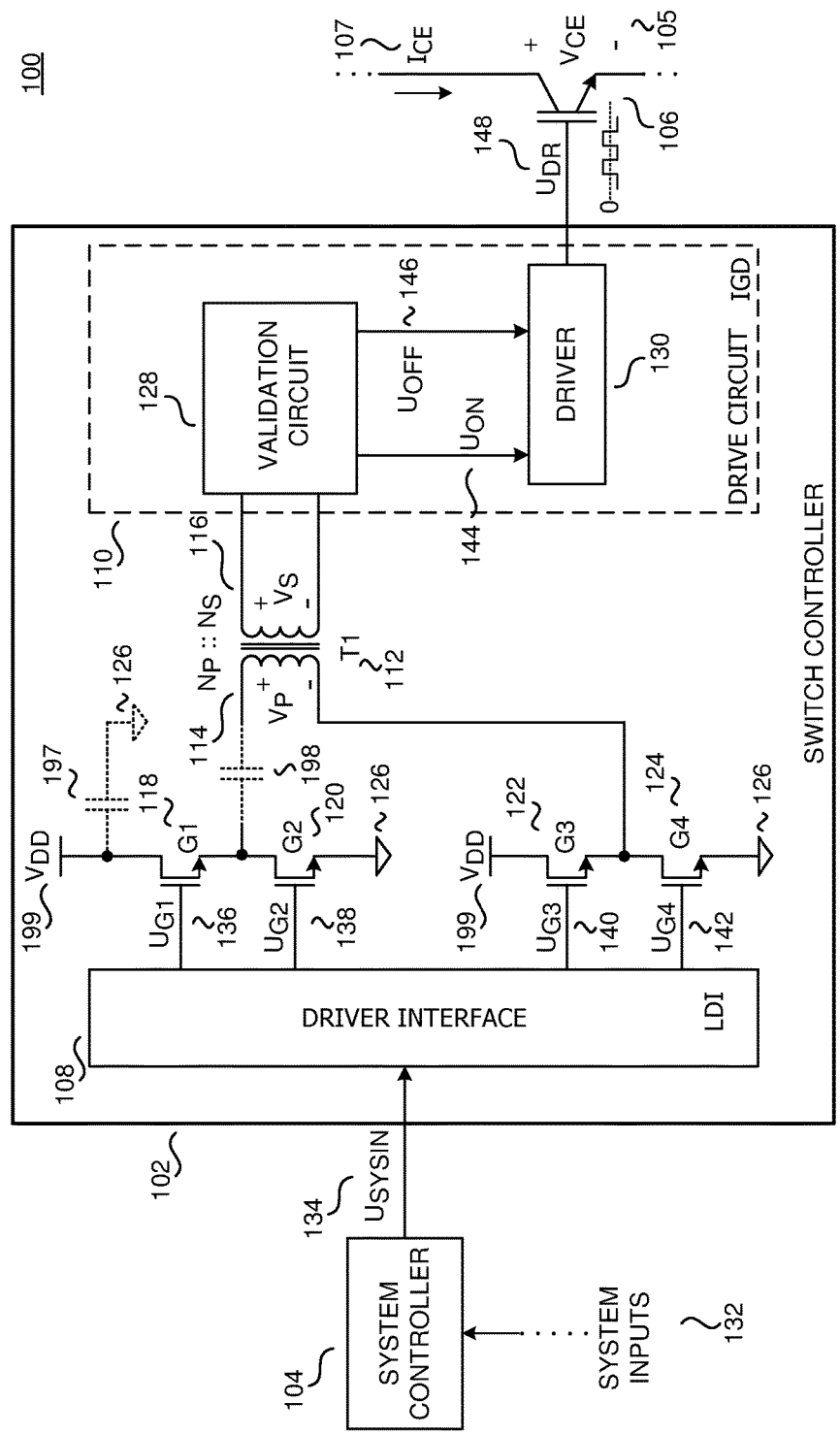
FIG. 1 shows one exemplary system including one of the control circuits described herein.

FIG. 1 shows a system for controlling a semiconductor switch 106. The circuits described herein are particularly suitable for controlling power semiconductor switches (such as, for example, power insulated-gate bipolar transistors (IGBTs), power metal oxide semiconductor field effect transistors (MOSFETs), power bipolar transistors, power injection enhancement gate transistors (IEGTs) and gate turn-off thyristors (GTOs)), that can also be used for controlling semiconductor switches in other fields. In addition, the power semiconductor switches may be based on gallium nitride (GaN) semiconductors or silicon carbide (SiC) semiconductors. The voltage and current of the power semiconductor switch 106 may be referred to as the switch current $I_{CE}$ 106 and switch voltage $V_{CE}$ 106.

The system 100 shown in FIG. 1 include a system controller 104, which communicates system control signal 134 ($U_{SYSIN}$) to a control circuit 102. The control circuit 102 has a primary side and a secondary side, which are galvanically isolated by a transformer 112. The semiconductor switch 106 is electrically connected to the secondary side. A driver interface 108 and a circuit for generating primary-side control signals ($U_{G1}$ 136, $U_{G2}$ 138, $U_{G3}$ 140, and $U_{G4}$ 142) are arranged on the primary side. The secondary side includes a validation circuit 128 and a driver circuit 130. The driver interface 108 receives the system controller signal 134 ($U_{SYSIN}$) and generates in response thereto various control signals $U_{G1}$ 136, $U_{G2}$ 138, $U_{G3}$ 140, $U_{G4}$ 142, which control a plurality of switches G1 118, G2 120, G3 122, G4 124 (four switches in the example in FIG. 1). As a result of the switching of the plurality of switches G1 118, G2 120, G3 122, G4 124, the terminals of a primary winding 114 of a transformer 112 can be coupled to either a first reference potential ($V_{DD}$ 199) or to a second reference potential 126. As a result, pulsed control signals (sent as primary voltage $V_p$) can be generated on the primary winding in response to the system controller signal 134 ($U_{SYSIN}$): since each of the terminals of the primary winding 114 of the transformer 112 can be coupled to one of the two reference potentials, it is possible to apply primary-side pulsed control signals to the primary winding. These control signals are transferred from the primary winding 114 to a secondary winding 116 of the transformer 112 on the secondary side.

The secondary winding 116 is connected to a validation circuit 128, in which the pulsed control signals (received as secondary voltage $V_S$) received on the secondary winding 116 are processed and the validity of said control signals is checked. If a pulsed control signal received on the secondary winding is declared to be valid by the validation circuit 128, the latter forwards a corresponding control signal 144, 146 ($U_{ON}$, $U_{OFF}$) to a driver circuit. The semiconductor switch 106 can be switched on or off in response to the control signals 144, 146 ($U_{ON}$, $U_{OFF}$).

Figure 3:
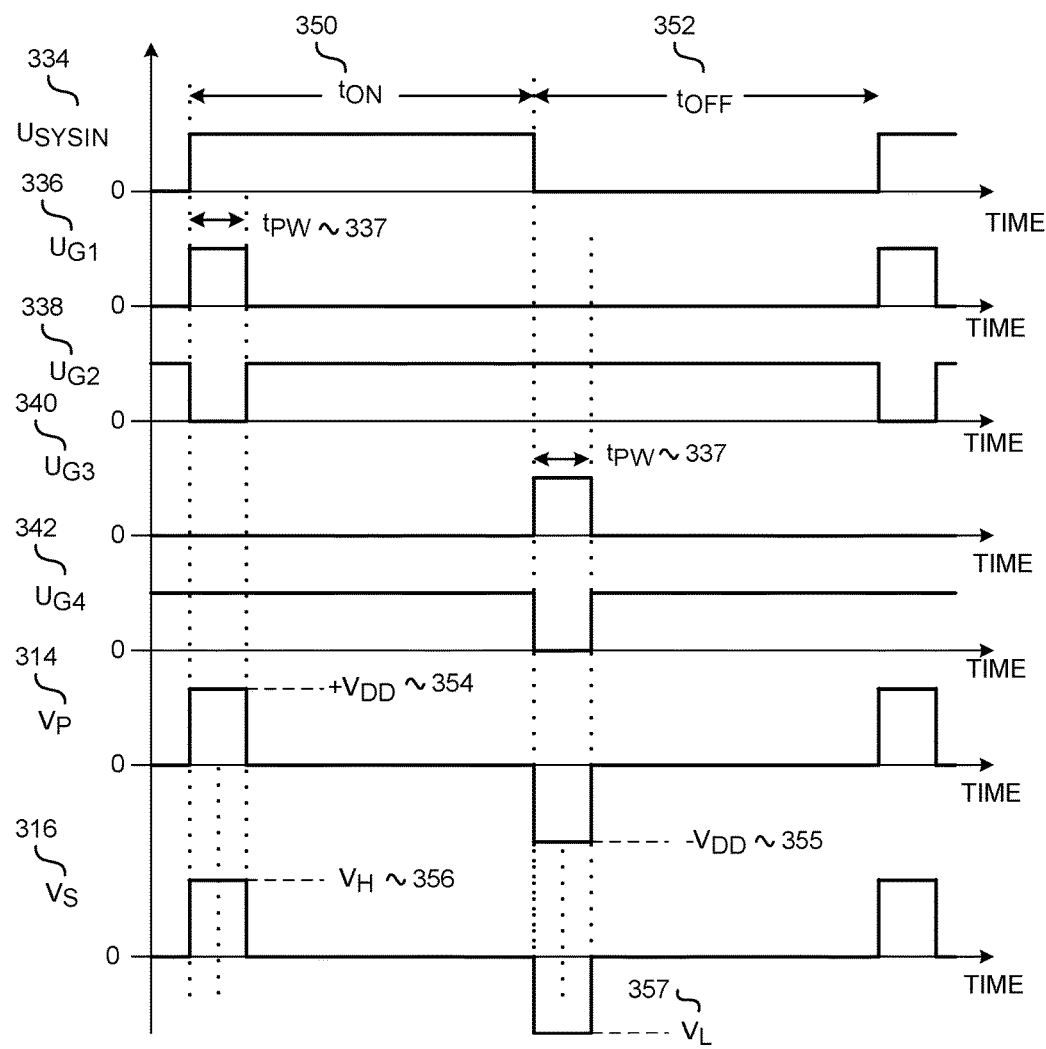
FIG. 3 shows various example signals from the circuit in FIG. 1.

FIG. 3 illustrates various signals from the circuit in FIG. 1. A system control signal 334 ($U_{SYSIN}$, which is one example of system control signal $U_{SYSIN}$ 134) has a first logic level if the semiconductor switch is intended to be in a switched-on state. Equally, the system controller signal 334 ($U_{SYSIN}$) has a second logic level if the semiconductor switch is intended to be in a switched-off state, or vice versa. The duration of the ON state 350 ($t_{ON}$) and the duration of the OFF state 352 ($t_{OFF}$) are defined in each case by the system controller and may be referred to as the intended on-time $t_{ON}$ and off-time $t_{OFF}$. The driver interface shown in FIG. 1 generates the various control signals $U_{G1}$ 336, $U_{G2}$ 338, $U_{G3}$ 340, $U_{G4}$ 342 (examples of control signals $U_{G1}$ 136, $U_{G2}$ 138, $U_{G3}$ 140, $U_{G4}$ 142) of the plurality of switches G1 118, G2 120, G3 122, G4 124 are then generated in response to the system control signal 334 ($U_{SYSIN}$).

In the example in FIG. 3, the plurality of switches 118, 120, 122, 124 are controlled such that a pulsed control signal $V_P$ 314 having the first logic level is generated on the primary winding in response to a rising edge of the system control signal 334 ($U_{SYSIN}$) (for this purpose, switch 118 ($G_1$) and switch 124 ($G_4$) are switched ON while switch 120 ($G_2$) and switch 122 ($G_3$) are switched OFF, such that a voltage of $V_{DD}$ 354 is present across the primary winding).

As shown in FIG. 3, the control signals $U_{G1}$ 336, $U_{G4}$ 342 are logic high while the control signals $U_{G2}$ 338 and $U_{G3}$ 340 are logic low with respect to the switches 118, 120, 122, 124. Further, after the leading edge of the system control signal 334 ($U_{SYSIN}$), the control signal $U_{G1}$ 336 is logic high for a pulse duration $t_{PW}$ 337 before falling to a logic low value and the control signal $U_{G2}$ 338 is logic low for the pulse duration $t_{PW}$ 337 before rising to a logic high value. As such the pulse control signal $V_P$ 314 is at the first logic level for the pulse duration $t_{PW}$ 337.

Equally, the plurality of switches 118, 120, 122, 124 are controlled such that a pulsed control signal having the second logic level (having opposite polarity compared with the first logic level) is generated on the primary winding in response to a falling edge of the system control signal 334 ($U_{SYSIN}$) (for this purpose, switch 120 ($G_2$) and switch 122 ($G_3$) are switched ON while switch 118 (G1) and 124 are switched OFF) such that a voltage of $-V_{DD}$ 355 is present across the primary winding 114. As shown in FIG. 3, control signals $U_{G1}$ 336, $U_{G4}$ 342 are logic low while the control signals $U_{G2}$ 338 and $U_{G3}$ 340 are logic high with respect to the switches 118, 120, 122, 124. Further, after the trailing edge of the system control signal 334 ($U_{SYSIN}$), the control signal $U_{G3}$ 340 is logic high for the pulse duration $t_{PW}$ 337 before falling to a logic low value and the control signal $U_{G4}$ 342 is logic low for the pulse duration $t_{PW}$ 337 before rising to a logic high value. As such the pulse control signal $V_P$ 314 is at the second logic level for the pulse duration $t_{PW}$ 337.

The pulsed control signal 314 thus signals that the semiconductor switch 106 is intended to be switched ON (rising edge of system controller signal 334) or OFF (falling edge of system controller signal 334) by pulsing to the first logic level (switch ON) or the second logic level (switch OFF) for the pulse duration $T_{PW}$ 337. The pulse duration 337 ($t_{PW}$) of the primary-side control pulses can be chosen depending on the respective application. In one example, the pulse length is less than 250 ns (and preferably less than 100 ns). In one case, the pulses of the primary-side control signal $V_P$ 314 are converted into corresponding pulses on the secondary-side control signal $V_S$ 316 (which have signal levels identical to or different than the pulses of the primary-side control signal $V_P$ 314, according to a turns ratio of the isolating transformer 112).

As can likewise be seen in FIGS. 1 and 3, the plurality of switches 118, 120, 122, 124 are controlled such that the terminals of the primary winding are short-circuited for a substantially low impedance onto the primary winding if no primary-side control pulse is intended to be transferred. For this purpose, switch 120 ($G_2$) and switch 124 ($G_4$) are switched on, such that both connections of the primary winding are at the second reference potential 126 (in another example, alternatively, switch 118 ($G_1$ and switch 122 (G3) can be switched on, such that both connections of the primary winding are at the first reference potential $V_{DD}$ 199). That may be advantageous—primarily in combination with isolating transformers in which the primary winding is arranged such that it at least partly shields the secondary winding from external alternating magnetic fields or at least partly compensates for magnetic fluxes generated by external alternating magnetic fields (such as, for example, the transformers in FIGS. 2A to 2E)—in order to reduce the influence of changes in the switch current $I_{CE}$ 107 through the semiconductor switch 106 or changes in the switch current of other semiconductor switches on the signals of the control circuit 102. However, the short-circuiting of the connections of the primary winding 114 of the transformer 112 can also be carried out differently than by the plurality of switches 118, 120, 122, 124 in FIG. 1. The relatively low impedance switched onto the primary winding 114 may be voltage source $V_{DD}$ 199 blocked by a bypass capacitor 197. Further, the relatively low impedance may be capacitor 198 in series with the primary winding 114.

Figure 4A:
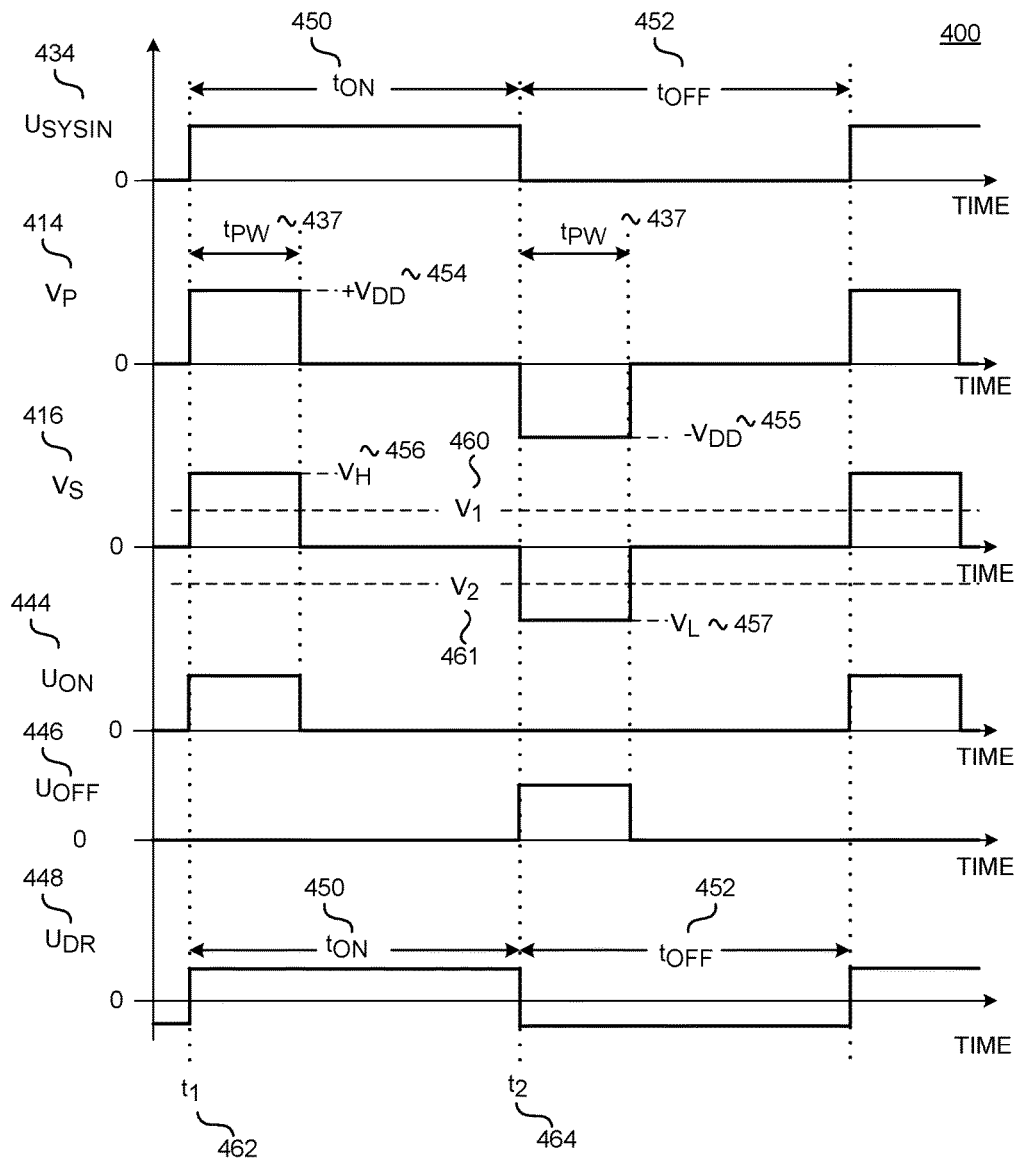
FIG. 4A shows various further example signals from the circuit in FIG. 1.
Figure 4B:
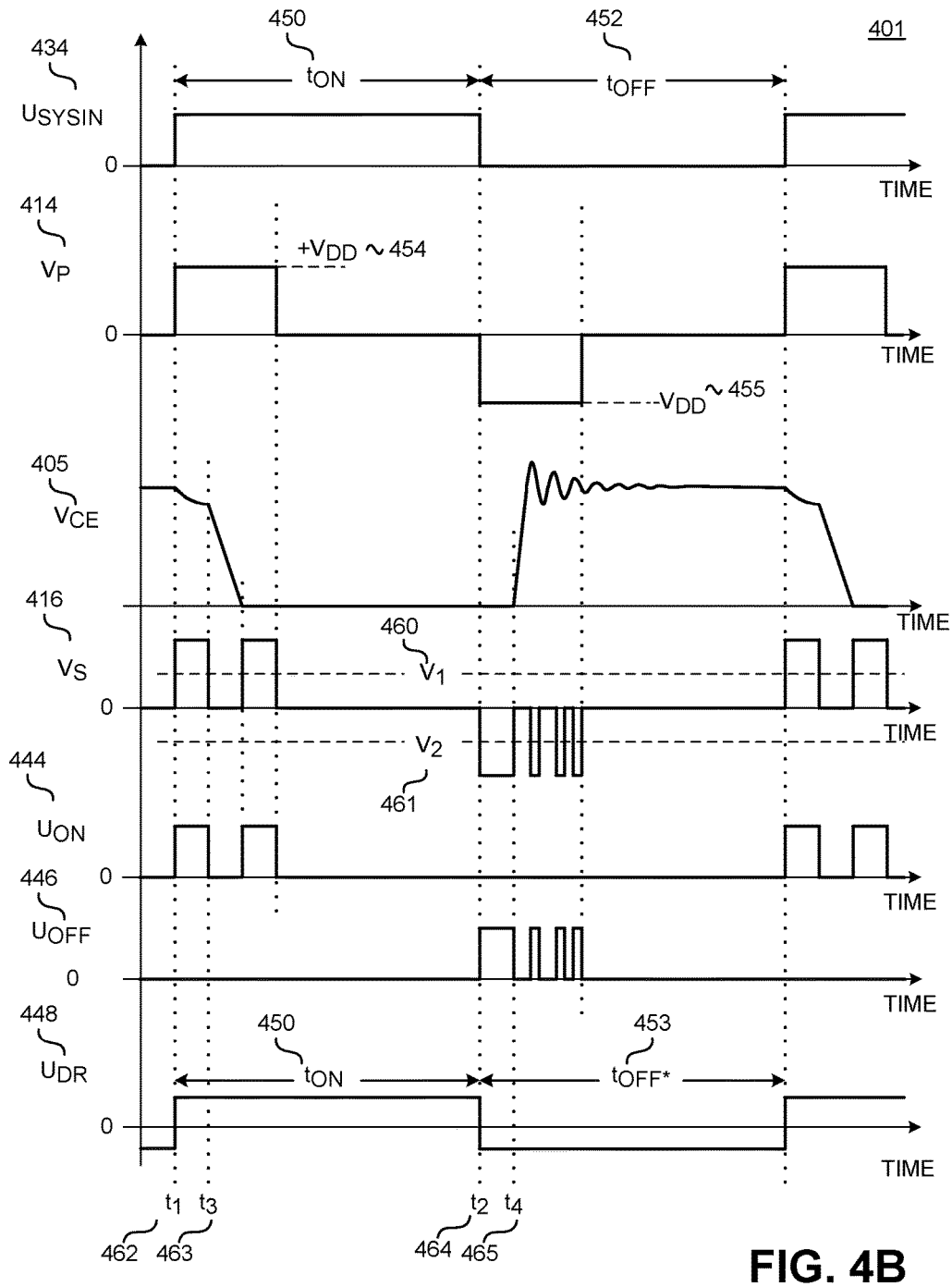
FIG. 4B shows various further example signals in a circuit in which disturbances generated as a result of a change in a voltage across the semiconductor switch occur.
Figure 4C:
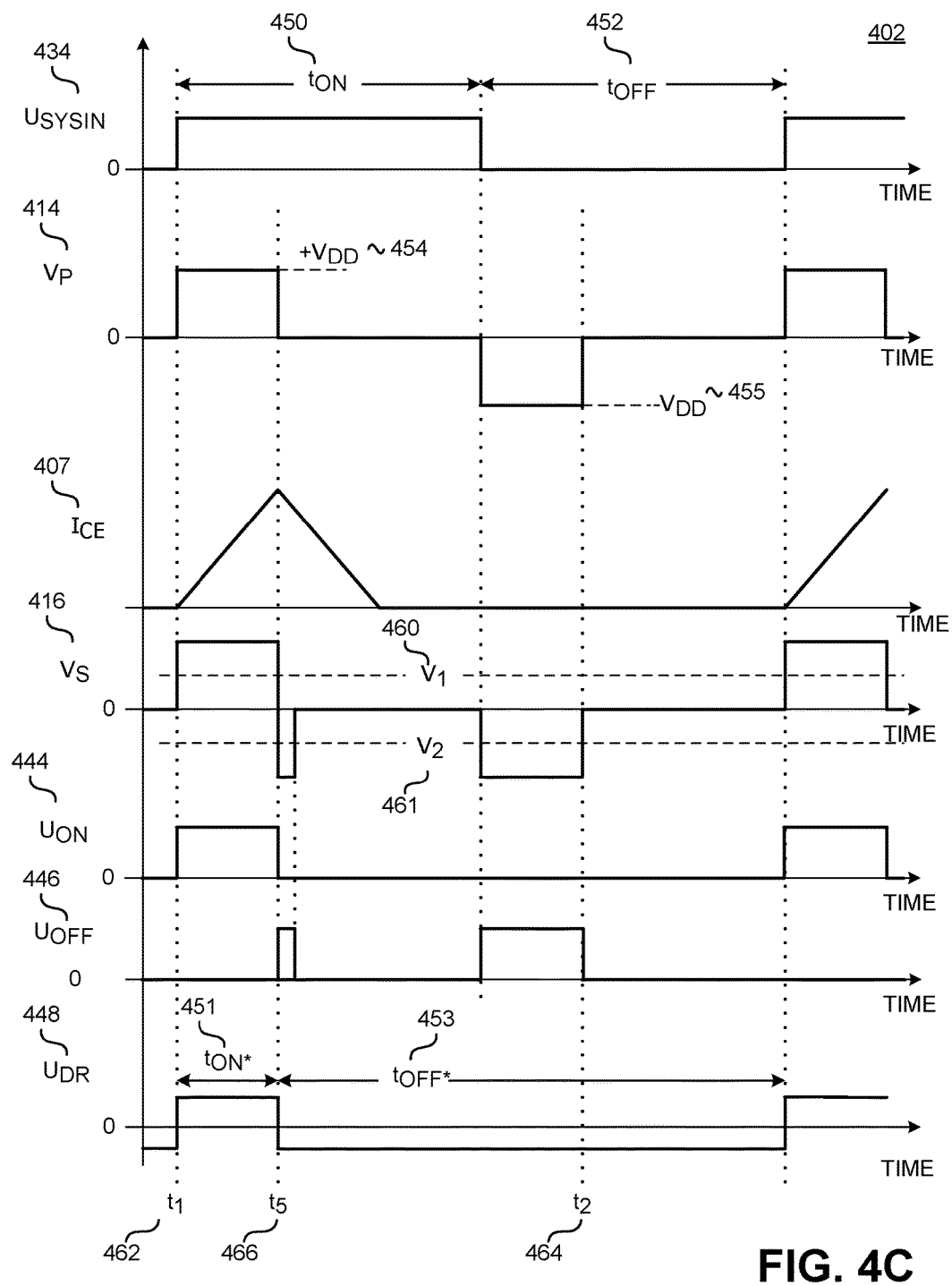
FIG. 4C shows various further example signals in a circuit in which disturbances generated as a result of a change in a current through the semiconductor switch occur.

FIG. 4A shows various further signals from the circuit in FIG. 1 in an idealized disturbance-free (otherwise referred to as noise-free) operating situation. In addition to the signals already explained with respect to FIG. 3, control signals 444, 446 ($U_{ON}$, $U_{OFF}$) of a validation circuit can be seen in FIG. 4A. In the example in FIG. 3, control signals 444, 446 ($U_{ON}$, $U_{OFF}$) of the validation circuit are responsive to the pulses on the secondary-side control signal $V_S$ 416 received on the secondary winding. In the illustrated figure, control signal 444 ($U_{ON}$) may pulse to a logic high level in response to a positive pulse on the secondary-side control signal $V_S$ 416 while the control signal 446 ($U_{OFF}$) may pulse to a logic high level in response to a negative pulse on the secondary-side control signal $V_S$ 416 (or vice versa). As can be seen in FIG. 4A, the semiconductor switch turns on or off in response to the control signals 444, 446 ($U_{ON}$, $U_{OFF}$). These switching processes have a certain intrinsic delay relative to the edges of the control signals 444, 446 ($U_{ON}$, $U_{OFF}$). The length of this delay may be dependent on the design of the semiconductor switch. FIG. 4A, FIG. 4B, and FIG. 4C omit the intrinsic delay and the signal processing delay of the switch controller 102.

Now that one example of the basic manner of operation of a control circuit of a semiconductor switch has been explained with respect to FIG. 1, FIG. 3 and FIG. 4A, some isolating transformers for control circuits will be discussed with respect to FIGS. 2A to 2E. As already explained, the control circuits discussed herein have an isolating transformer (for example isolating transformer 112 in FIG. 1) in which the primary winding is arranged such that it at least partly shields the secondary winding from external alternating magnetic fields or at least partly compensates for magnetic fluxes generated by external alternating magnetic fields (for example, an interference signal occurring on the secondary side during operation can be less than 50%, and in some examples also less than 20%, of the signal level of a secondary-side control signal).

Figure 2B:
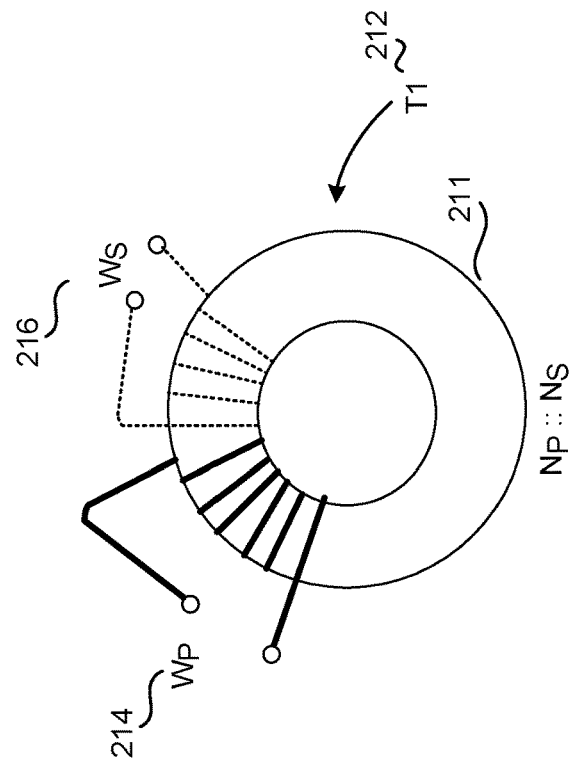
FIG. 2B shows a further exemplary isolating transformer which can be used in one of the control circuits described herein.
Figure 2A:
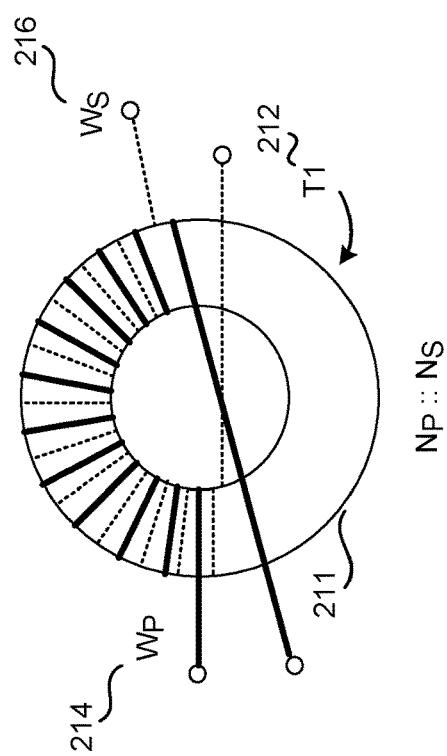
FIG. 2A shows one exemplary isolating transformer which can be used in one of the control circuits described herein.

The shielding or compensation can be implemented in a number of ways. In the transformer 212 illustrated in FIG. 2A, the primary 214 and secondary windings 216 of the transformer 212 are wound in an interleaved manner. The primary 214 and secondary windings 216 of the transformer 212 can also be wound (at least partly) in a bifilar arrangement. This can result in compensation of a magnetic flux generated by external magnetic fields in the secondary winding by means of a current in the primary winding which reduces a resulting magnetic field into the secondary winding. A similar effect can be achieved if, as shown in FIG. 2B, the primary 214 and secondary windings 216 of the transformer 212 are wound very narrowly in each case (in other words they overlap over less than one quarter of a circumference of a transformer core 211 of the transformer 212). The features illustrated in FIGS. 2A and 2B can also be combined.

Figure 2E:
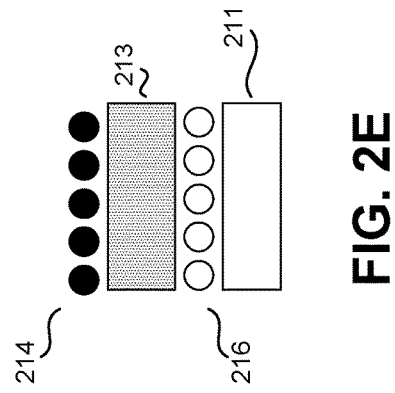
FIG. 2E shows a sectional view through the isolating transformer from FIGS. 2C and 2D.
Figure 2C:
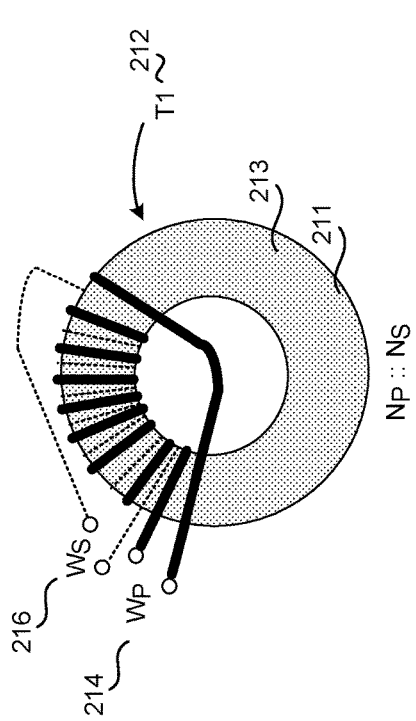
FIG. 2C shows a further exemplary isolating transformer which can be used in one of the control circuits described herein.
Figure 2D:
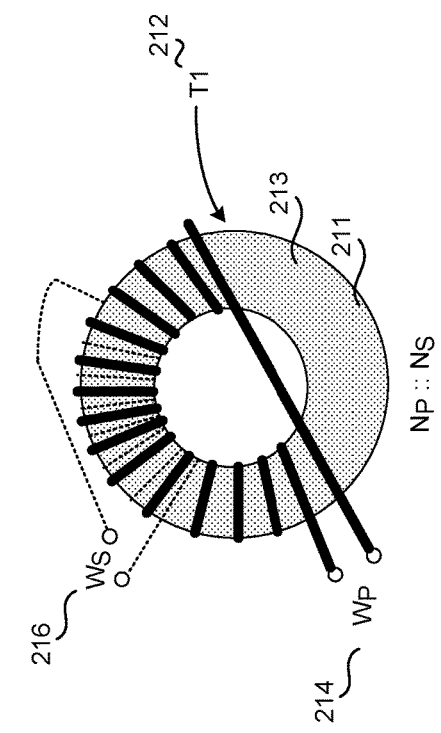
FIG. 2D shows a further exemplary isolating transformer which can be used in one of the control circuits described herein.

In the transformers in FIG. 2C and FIG. 2D, the primary winding 214 surrounds the secondary winding 216 (that is to say that the primary winding 214 has a larger diameter than the secondary winding 216 and the secondary winding 216 is arranged within a space defined by the primary winding). In this arrangement, the primary winding 214 shields the secondary winding 216 from magnetic fluxes generated by external alternating magnetic fields by means of the formation of a (at least partly) field-free space (by way of example, an external alternating magnetic field within the primary turn has at most one tenth of the intensity compared with the magnetic field outside the primary turn). In this case, the primary winding 214 can be wound directly over the secondary winding 216. In other examples, there is a predetermined distance between the primary winding 214 and the secondary winding 216. As can be seen in FIG. 2E, a spacer 213 (for example an insulation device) can be arranged between the primary winding 214 and the secondary winding 216 in order to space apart the primary winding 214 from the secondary winding 216. FIG. 2E illustrates the spacer 213 where the primary winding 214 overlaps the secondary winding 216 in both FIG. 2C and FIG. 2D.

The above-discussed arrangements of the windings can also be combined. By way of example, a first and a second winding can have different arrangements in sections.

Although transformers having toroidal cores are shown in FIGS. 2A to 2D, the arrangements of the primary and secondary windings described with reference to FIGS. 2A to 2D can also be used with other transformers. In this regard, winding cores having different geometries can be used (e.g. rectangular cores with and without cutouts). In other examples, the isolating transformer can be designed as a planar transformer in which a primary winding is arranged such that it at least partly shields a secondary winding from external alternating magnetic fields or at least partly compensates for magnetic fluxes generated by external alternating magnetic fields.

As already explained in connection with FIG. 1 and FIG. 3, the control circuits described herein can be designed to short-circuit the primary winding of the transformer. A shielding or compensation effect can be all the more effective the lower an impedance is between the terminals of the primary winding of the transformer. In one example, an impedance between the connections of the primary winding of the transformer is lower than 20 ohms (a).

Various aspects of control circuits will be discussed below with reference to FIGS. 5A to 6B. However, the effects of the capacitive and inductive disturbances already mentioned above will be further discussed.

FIG. 4B shows various signals in a circuit in which disturbances (also referred to as noise) are generated as a result of a change in a voltage across the semiconductor switch. In FIG. 4B, it is assumed for the purposes of the explanation that a validation circuit described herein does not intervene (in other words, the disturbances are not alleviated or eliminated). As described with reference to FIG. 4B, pulsed primary-side control signals 414 are generated in the primary winding. The curve 405 shows one exemplary profile of a voltage $V_{CE}$ across a semiconductor switch. As can be seen, the voltage $V_{CE}$ 405 across the semiconductor switch varies while a pulsed control signal $V_P$ 414 is transferred. In one example, the voltage $V_{CE}$ 405 across the semiconductor switch falls when the semiconductor switch is turned on. As already explained, such a change can couple to the control circuit as a result of parasitic capacitances. In FIG. 4B, it can be seen in curve 416 that such couplings can have influences on the profile of the pulsed control signals received in the secondary winding (secondary voltage $V_S$ 416). A capacitive disturbance generated by the falling edge of the voltage $V_{CE}$ 405 across the semiconductor switch is superposed on the secondary-side control pulse $V_S$ 416 shown on the left side of FIG. 4B. A capacitive disturbance generated by an oscillation of the voltage $V_{CE}$ 405 across the semiconductor switch after the semiconductor switched is turned on is superposed on the secondary-side control pulse $V_S$ 416 shown on the right side of FIG. 4B. In both cases, the shape of the secondary-side control pulse $V_S$ 416 is greatly disturbed. That can have the effect that a valid pulsed control signal is not identified as such and, as a consequence, no switching process of the semiconductor switch is triggered.

FIG. 4C shows various further signals in a circuit in which disturbances generated as a result of a change in a current $I_{CE}$ 407 through the semiconductor switch occur. In FIG. 4C as well it is assumed for the sake of explanation that a validation circuit described herein does not intervene. As described with reference to FIG. 4C, pulsed primary-side control signals 414 are generated in the primary winding. The curve 407 shows one exemplary profile of a switch current $I_{CE}$ 407 through a semiconductor switch. Since the current $I_{CE}$ 407 varies in the region of the first pulsed control signal 414 due to the proximity of the semiconductor switch, a disturbance can be superposed on a secondary-side pulsed control signal 416 as a result of inductive coupling. The disturbance shown in FIG. 4C generates a pulsed interference signal of opposite polarity compared with the first pulse of the control signal 416. Said pulsed interference signal may thus be interpreted incorrectly as a control signal for switching off the semiconductor switch. That is what is shown in FIG. 4C: control signal 446 ($U_{OFF}$), formed on the basis of a comparison of the pulsed control signal 416 received on the secondary side with a lower threshold value 461 ($V_2$), includes (in the region of the pulsed interference signal) a signal component which leads to the semiconductor switch being erroneously switched off (at the time is 466 rather than switching off at time $t_2$ 464). With the aid of the validation circuits described herein, the consequences of the disturbances outlined in with respect to FIG. 4B and FIG. 4C can be alleviated or rectified at least in some situations.

Figure 5A:
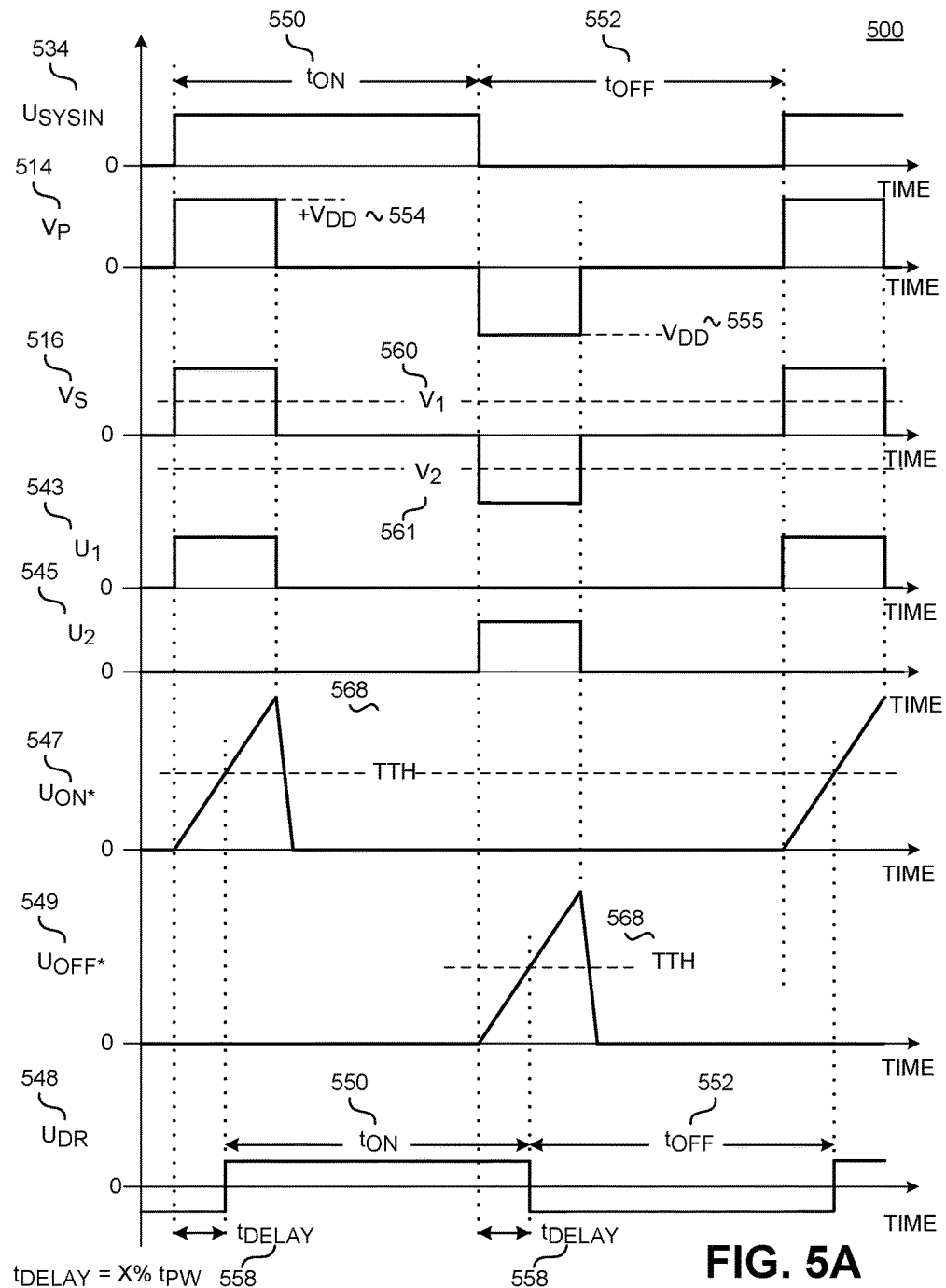
FIG. 5A shows various further example signals in a circuit in which pulsed signals received on the secondary side are converted into a validation signal in the absence of disturbances.
Figure 5B:
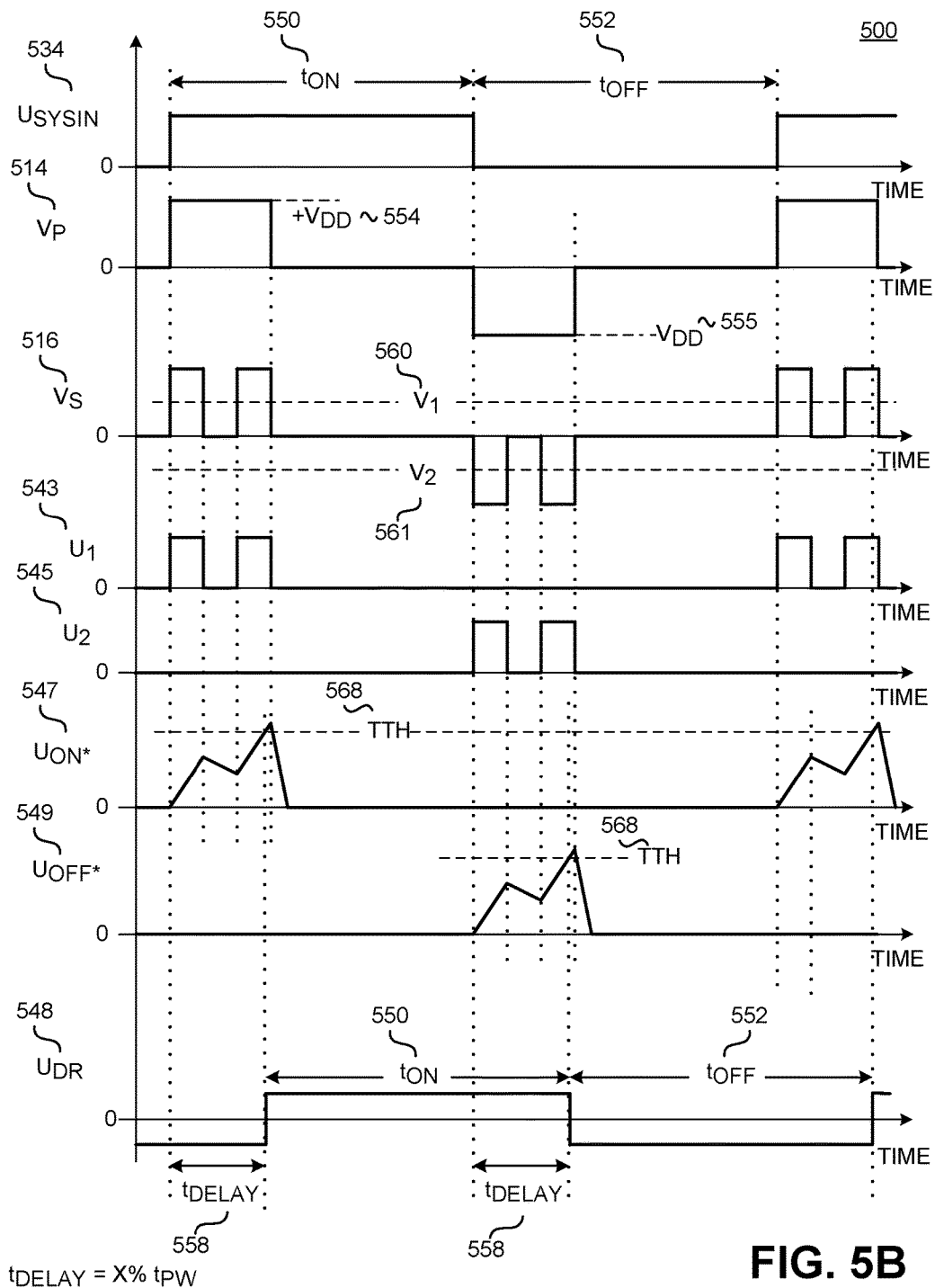
FIG. 5B shows various further example signals in a circuit in which pulsed signals received on the secondary side are converted into a validation signal in the presence of disturbances generated as a result of a change in a voltage across the semiconductor switch.
Figure 5C:
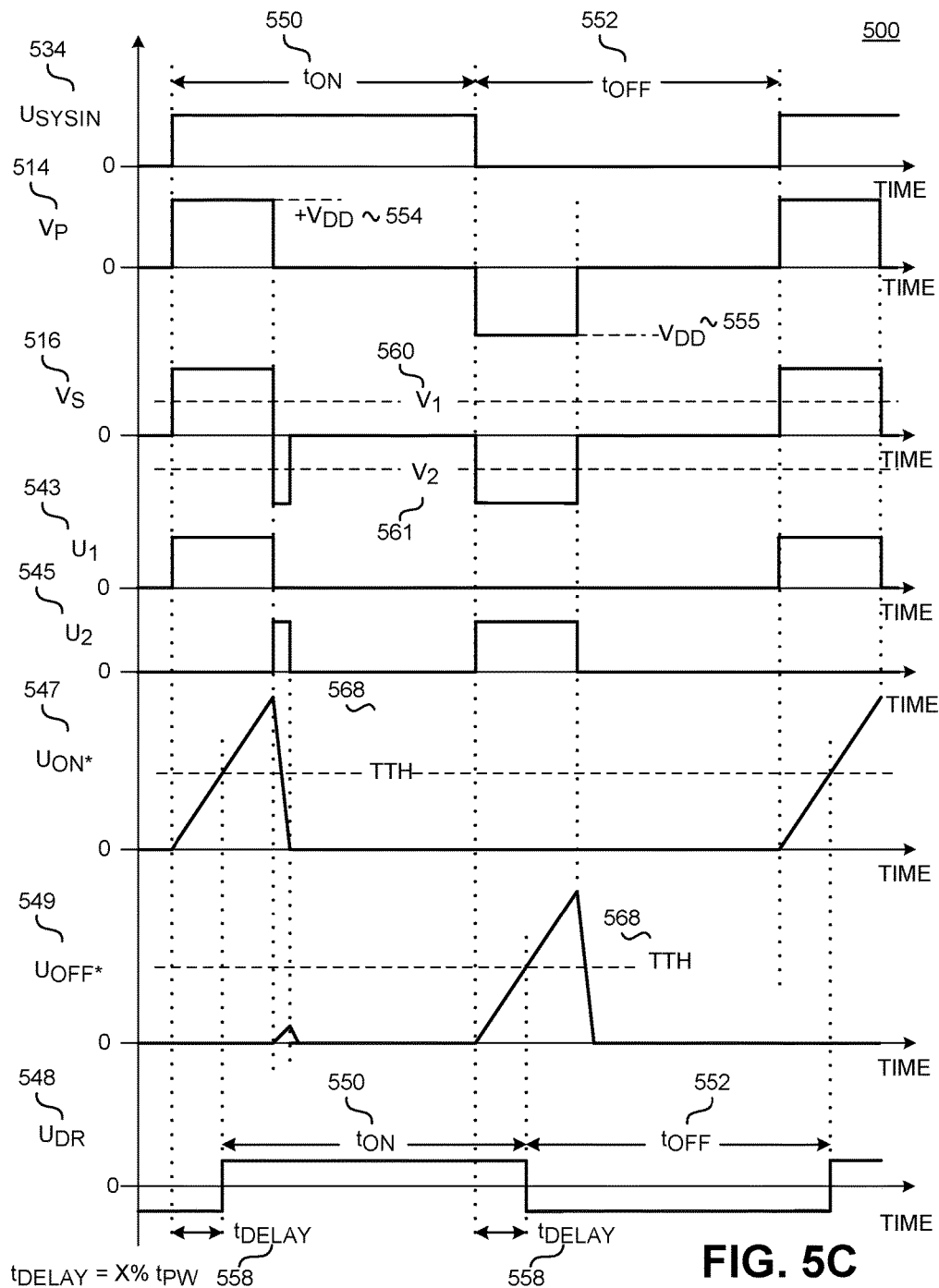
FIG. 5C shows various further example signals in a circuit in which pulsed signals received on the secondary side are converted into a validation signal in the presence of disturbances generated as a result of a change in a current through the semiconductor switch.

FIGS. 5A, 5B and 5C show the situations from FIGS. 4A, 4B and 4C in each case but with an intervening validation circuit. Validation signals 547, 549 are generated from the control signals 516 received on the secondary side. In the example of FIGS. 5A, 5B and 5C, generating the validation signals 547, 549 includes charging or discharging a capacitance in the validation circuit in response to control signals 516 received on the secondary side. In one example, a signal level of a first validation signal 547 ($U_{ON*}$) is increased at a first rate if a level of the pulsed control signal 516 received on the secondary winding is above a first predetermined threshold voltage 560 ($V_1$). In addition, the signal level of the first validation signal 547 ($U_{ON*}$) is decreased at a second rate (under certain circumstances down to a signal level at which the capacitance is totally discharged) if a level of the pulsed control signal 516 received on the secondary winding is below the first predetermined threshold voltage 560 ($V_1$), wherein the first rate is greater than the second rate. As such, dips (see FIG. 5B and as discussed with respect to FIG. 4B) and pulsed interference signals of opposite polarity (see FIG. 5C and as discussed with respect to FIG. 4C) may not lead to erroneous switching processes of the semiconductor switch. In other examples, an active or passive filter circuit included in the validation circuit can filter the control signals 516 received on the secondary side. As a result, a validation signal can be generated which, as described below, can be used for determining the validity of the control signals 516 received on the secondary side. In other examples, a validation signal can be generated by summation of the pulse lengths of the control signals 516 received on the secondary side.

The determination of whether a control signal is valid can be carried out by the validation circuit in response to the validation signal 547, 549 in various ways. By way of example, as can be seen in FIG. 5A, FIG. 5B, and FIG. 5C, a control signal 516 can be declared to be valid if the corresponding validation signal 547 or 549 exceeds a predetermined threshold value. In 5A, FIG. 5B, and FIG. 5C, the predetermined threshold value is a signal level threshold value 568 (TTH). In other examples, the threshold value can also be a predetermined time duration of a pulse in one of the validation signals 547, 549. In yet other examples, it is possible to determine whether one of the validation signals 547, 549 exceeds a specific signal level for a predetermined time duration. In one example, the predetermined time duration is greater than 20% of the duration of the control signal 514. In another example, the predetermined time duration is greater than 40% of the duration of the control signal 514. Further the difference between the duration of the control signal 514 and the predetermined time duration is less than 100 nanoseconds (ns). Further, the difference may be less than 50 ns or less than 30 ns. The second validation signal 549 can also correspond to a voltage across a (second) capacitance in the validation circuit.

In FIGS. 5A, 5B and 5C, the pulsed control signals 514, 516 have a first polarity if the semiconductor switch is intended to be switched on, and a second, opposite polarity if the semiconductor switch is intended to be switched off. Furthermore, two validation signals 547, 549 are generated, on the basis of which the validity of a switch-on control signal and of a switch-off control signal can be determined in each case. The second validation signal 549 is generated here in a manner similar to the first validation signal 547. The difference therefrom is that a determination is made as to whether a level of the pulsed control signal 516 received on the secondary winding is below a second predetermined threshold voltage 561 ($V_2$). If that is the case, a level of the second validation signal is increased at a first rate. If that is not the case, the signal level of the first validation signal is decreased at a second rate. In one example, the first rate can be greater than the second rate (for example more than twice as high). In other examples, the first rate and the second rate can also be of identical magnitude. As shown in FIG. 5A, FIG. 5B, and FIG. 5C, in one example, the first predetermined threshold voltage 560 ($V_1$) may be a positive value while the second predetermined threshold voltage 561 ($V_2$) may be a negative value.

As shown in FIG. 5B, despite the dips shown in the pulsed control signal 516 due to the disturbances cause by the voltage $V_{CE}$ across the semiconductor switch, the pulsed control signal 516 is validated. Once the validation signal 547 reaches the signal level threshold value 568 (TTH), the drive signal 548 ($U_{DR}$) transitions to a logic high value and turns on the semiconductor switch. Once the validation signal 549 reaches the signal level threshold value 568 (TTH), the drive signal 548 ($U_{DR}$), the drive signal 548 ($U_{DR}$) transitions to a logic low value and turns off the semiconductor switch. As compared to the system input signal 534 ($U_{INSYS}$) the drive signal 548 ($U_{DR}$) transitions states a delay time 558 ($t_{DELAY}$) after the transitions of the system input signal 534 ($U_{INSYS}$). The delay time 558 ($t_{DELAY}$) may be due to the time it takes for the validation circuit to validate the received pulsed control signal 516.

As shown in FIG. 5C, despite the pulsed interference signal of opposite polarity shown in the pulsed control signal 516 due to the disturbances cause by the current $I_{CE}$ across the semiconductor switch, the pulsed control signal 516 is validated. The pulsed interference signal of opposite polarity is greater than the second predetermined threshold 561 ($V_2$) and as such the validation signal 549 increases for at a first rate. However, the validation signal 549 does not reach the signal level threshold value 568 (TTH) due to the pulsed interference signal of opposite polarity and it is ignored and the validation signal 547 to turn on the semiconductor switch is not interfered with. Similar to FIG. 5B, as compared to the system input signal 534 ($U_{INSYS}$) the drive signal 548 ($U_{DR}$) transitions states a delay time 558 ($t_{DELAY}$) after the transitions of the system input signal 534 ($U_{INSYS}$). The delay time 558 ($t_{DELAY}$) may be due to the time it takes for the validation circuit to validate the received pulsed control signal 516. FIG. 5A also illustrates a delay time $t_{DELAY}$ 588 due to the time it takes for the validation signals 547, 549 ($U_{ON*}$, $U_{OFF*}$) to reach the signal level threshold value 568 (TTH) even without the presence of noise/disturbances. However, the delay time $t_{DELAY}$ 588 illustrated in FIG. 5A may be shorter than the delay time $t_{DELAY}$ 588 illustrated in FIG. 5B and FIG. 5C since the increasing of the validation signals 547, 549 ($U_{ON*}$, $U_{OFF*}$) may not be interrupted.

Figure 6A:
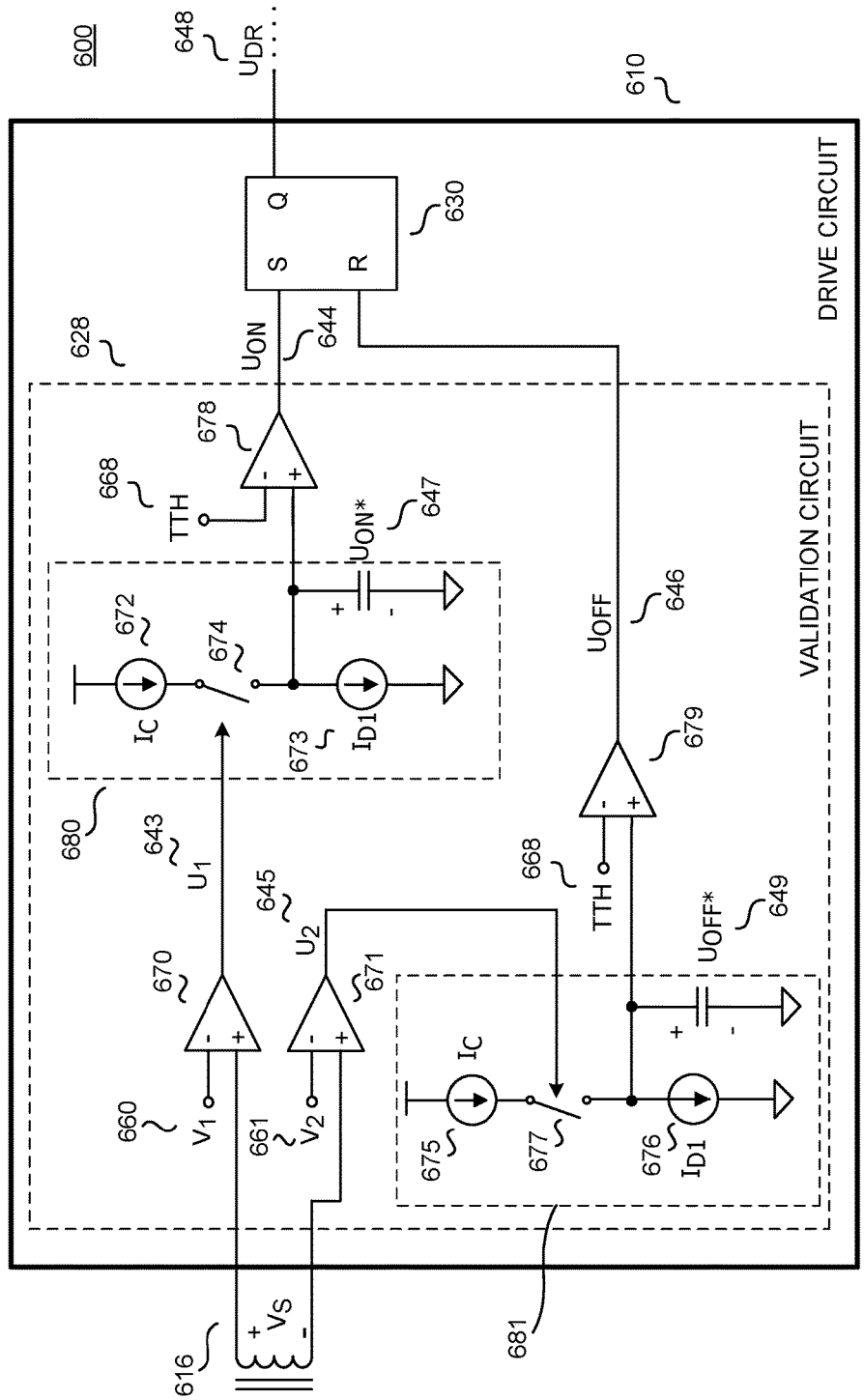
FIG. 6A shows one exemplary validation circuit.

One exemplary validation circuit 628 is illustrated in FIG. 6A. The validation circuit comprises two first comparison circuits 670, 671 and two integration circuits 680, 681 and also two comparators 678, 679. A signal 616 received on the secondary winding (for example a pulsed control signal on which disturbances are superposed) is fed into the validation circuit. In the example in FIG. 6A, the signal 616 received on the secondary winding is compared with a first threshold voltage 660 ($V_1$) and with a second threshold voltage 661 ($V_2$). A non-inverting input of the first comparison circuit 670 for carrying out the comparison with the first threshold voltage 660 ($V_1$) is connected to a first terminal of the secondary winding in such a way that it is possible to detect whether a potential of the first terminal of the secondary winding is above the first threshold voltage 660 ($V_1$). In other words, a check is made to ascertain whether a level of the signal 616 received on the secondary winding is above the first threshold voltage 660 ($V_1$). A non-inverting input of the second comparison circuit 671 for carrying out the comparison with the second threshold voltage 661 ($V_2$) is connected to the second terminal of the secondary winding in such a way that it is possible to detect whether a potential of the second terminal of the secondary winding is above the second threshold voltage 661 ($V_2$). In other words, a check is made to ascertain whether a level of the signal 616 received on the secondary winding is below the second threshold voltage 661 ($V_2$). The respective output signals 643, 645 ($U_1$, $U_2$) of the first comparison circuit 670 and of the second comparison circuit 671 are fed into the two integration circuits 680, 681. In the example in FIG. 6A, both integration circuits 680, 681 have a similar construction.

An output signal 643, 645 ($U_1$, $U_2$) of each of the two comparison circuits 670, 671 switches a switch 674, 677 included the integration circuits 680,681. A first current source 672, 675 is coupled to a respective capacitance via respective switch. As a result, the respective capacitance is charged with a first current $I_C$. As a consequence, a voltage across the respective capacitances rises at a first rate. In addition, the integration circuits 680, 681 include a second current source 673, 676. Via the latter, the respective capacitances are discharged by means of a second current $I_{D1}$ at a second rate. Since the second current $I_{D1}$ has a lower current value than the first current $I_C$, the capacitances are discharged if the associated switches 674, 677 are open (in other words a potential of the first terminal of the secondary winding is below the first threshold voltage 660 ($V_1$) in the case of the first integration circuit 680 and if a potential of the second terminal of the secondary winding is below the second threshold voltage 661 (V2) in the case of the second integration circuit 681). Moreover, the first current $I_C$ can be chosen such that the first rate is greater than the second rate (for example more than twice as great). The voltage across the capacitance of the first integration circuit 680 can be used as first validation signal 647 ($U_{ON*}$). The voltage across the capacitance of the second integration circuit 681 can be used as second validation signal 649 ($U_{OFF*}$). In the example in FIG. 6A, the first and second validation signals 647, 649 ($U_{ON*}$, $U_{OFF*}$) are respectively compared by comparators 678, 679 with a threshold value 668 (TTH). If the first validation signal 647 ($U_{ON*}$) is above the threshold value 668 (TTH), then the received control signal is declared to be valid and a secondary-side control signal 644 ($U_{ON}$) is forwarded to the driver circuit. The driver circuit switches the semiconductor switch on (for example by virtue of a secondary-side control signal 644 ($U_{ON}$), which is an output signal of the first comparator 678, being applied to the SET input of an RS flip-flop 630). If the second validation signal 649 ($U_{OFF*}$) is above the second threshold value 668 (TTH), then the received control signal is declared to be valid. The driver circuit switches the semiconductor switch off (for example by virtue of a second secondary-side control signal 646 ($U_{OFF}$), which is an output signal of the second comparator 679, being applied to the RESET input of an RS flip-flop 630). In this way, the influence of disturbances as shown in FIG. 5B or 5C can be reduced or completely prevented.

Figure 6B:
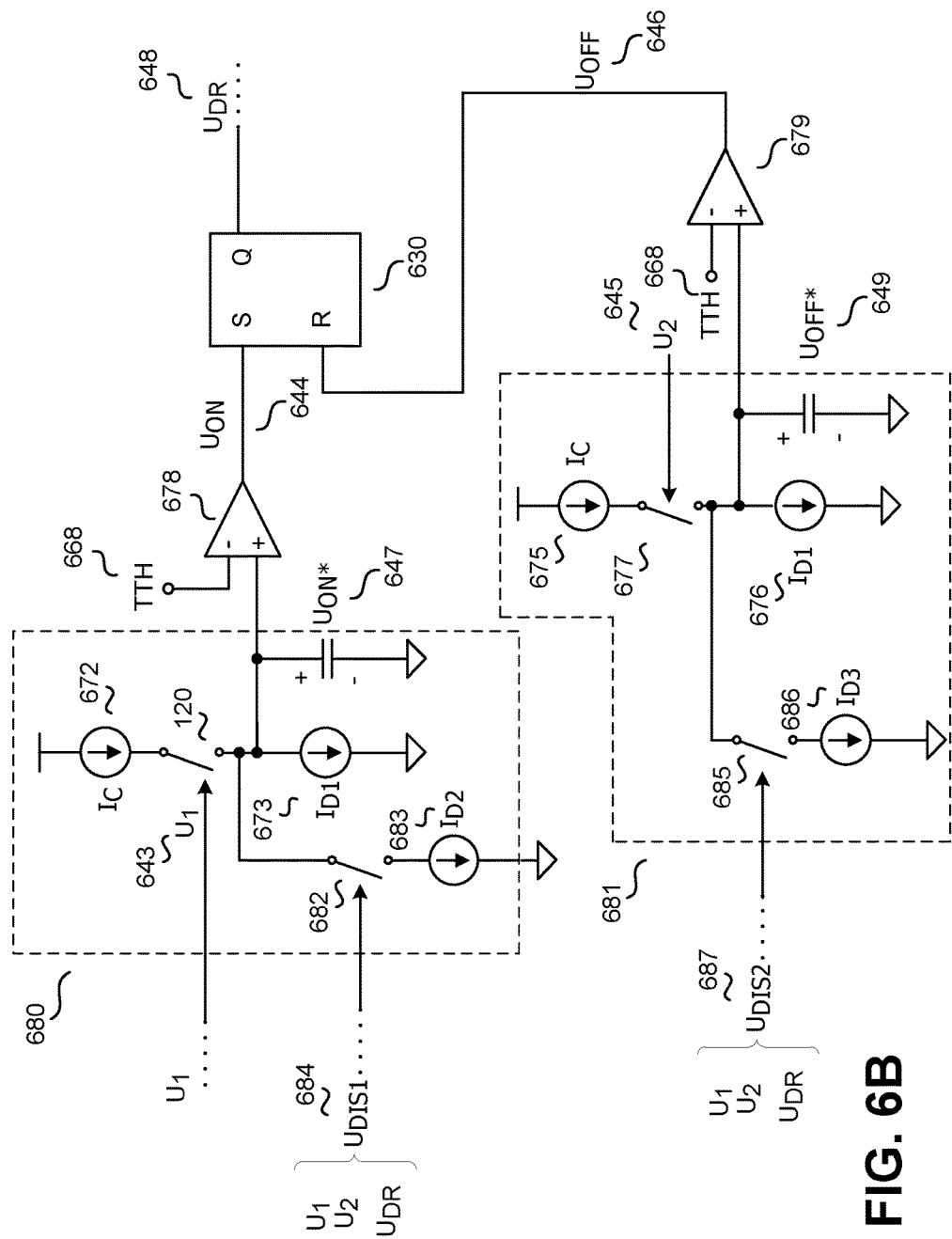
FIG. 6B shows a further exemplary validation circuit.

FIG. 6B shows a part of a further validation circuit. This validation circuit largely corresponds to the validation circuit 628 in FIG. 6A. However, the first integration circuit 680 comprises a further current source 683 with current $I_{D2}$, which can be coupled to the capacitance of the first integration circuit 680 via a further switch 682. Similarly, the second integration circuit 681 also includes a further current source 686 with current $I_{D3}$, which can be connected to the capacitance of the second integration circuit 681 via a further switch 685. In this way, an additional current $I_{D2}$ and $I_{D3}$ can be switched to additionally discharge the respective capacitances. The further switches 682, 685 can be switched on in response to a discharge signal 684, 687 ($U_{DIS1}$, $U_{DIS2}$). Said discharge signals 684, 687 ($U_{DIS1}$, $U_{DIS2}$) can be generated for example on the one or more of the combination of the output signals 643, 645 (U1, U2) of the first and second comparators 670, 671 (not shown in FIG. 6B), respectively, and a driver signal 648 ($U_{DR}$) for the semiconductor switch. In one example, the respective discharge signals 684, 687 ($U_{DIS1}$, $U_{DIS2}$) can switch in the additional discharge current $I_{D2}$, $I_{D3}$ if a corresponding switching process (ON in the case of the first integration circuit 680 and OFF in the case of the second integration circuit 681) was triggered. The respective capacitance can thus be discharged more rapidly.

Figure 6C:
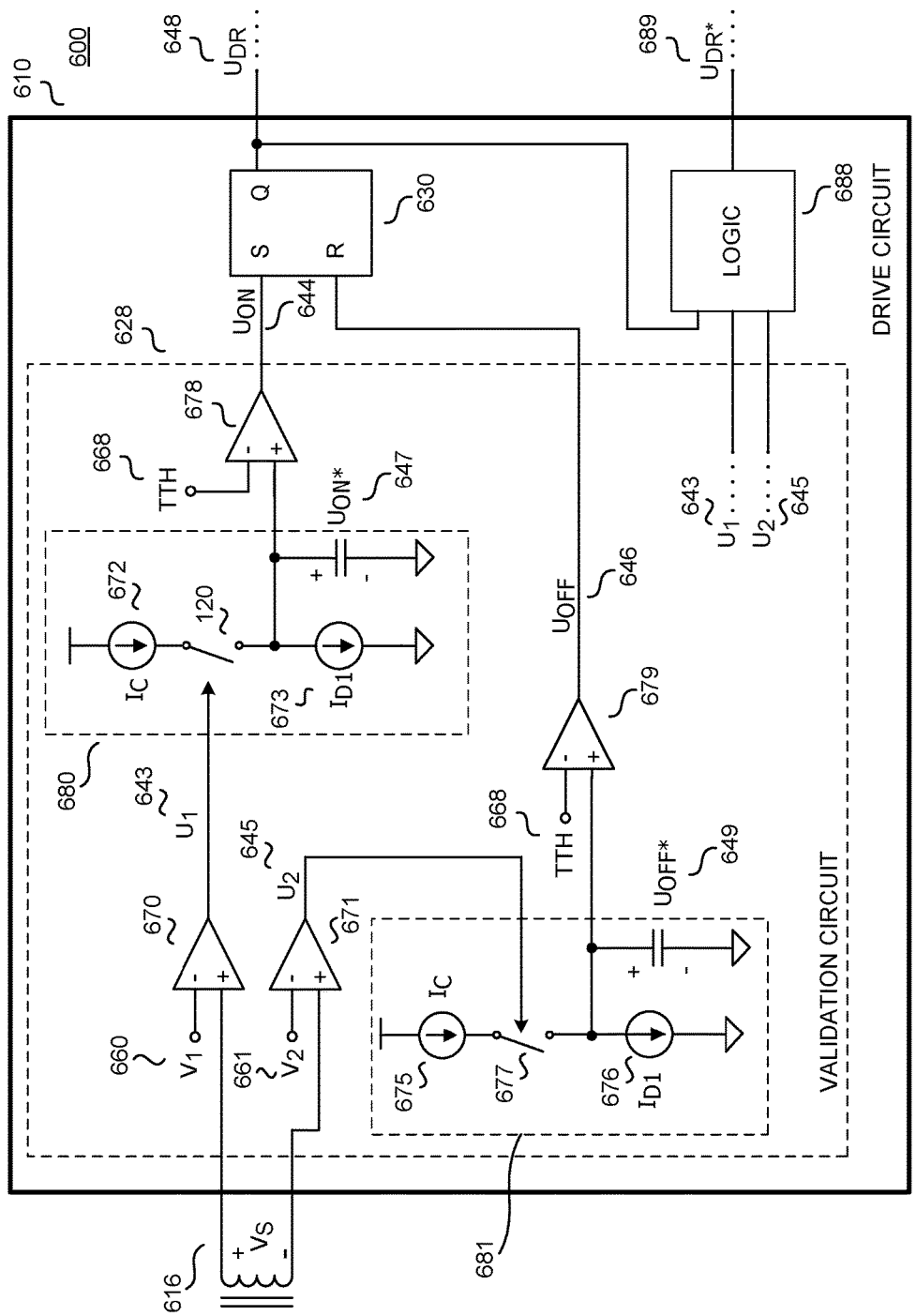
FIG. 6C shows a further exemplary validation circuit.
Figure 7:
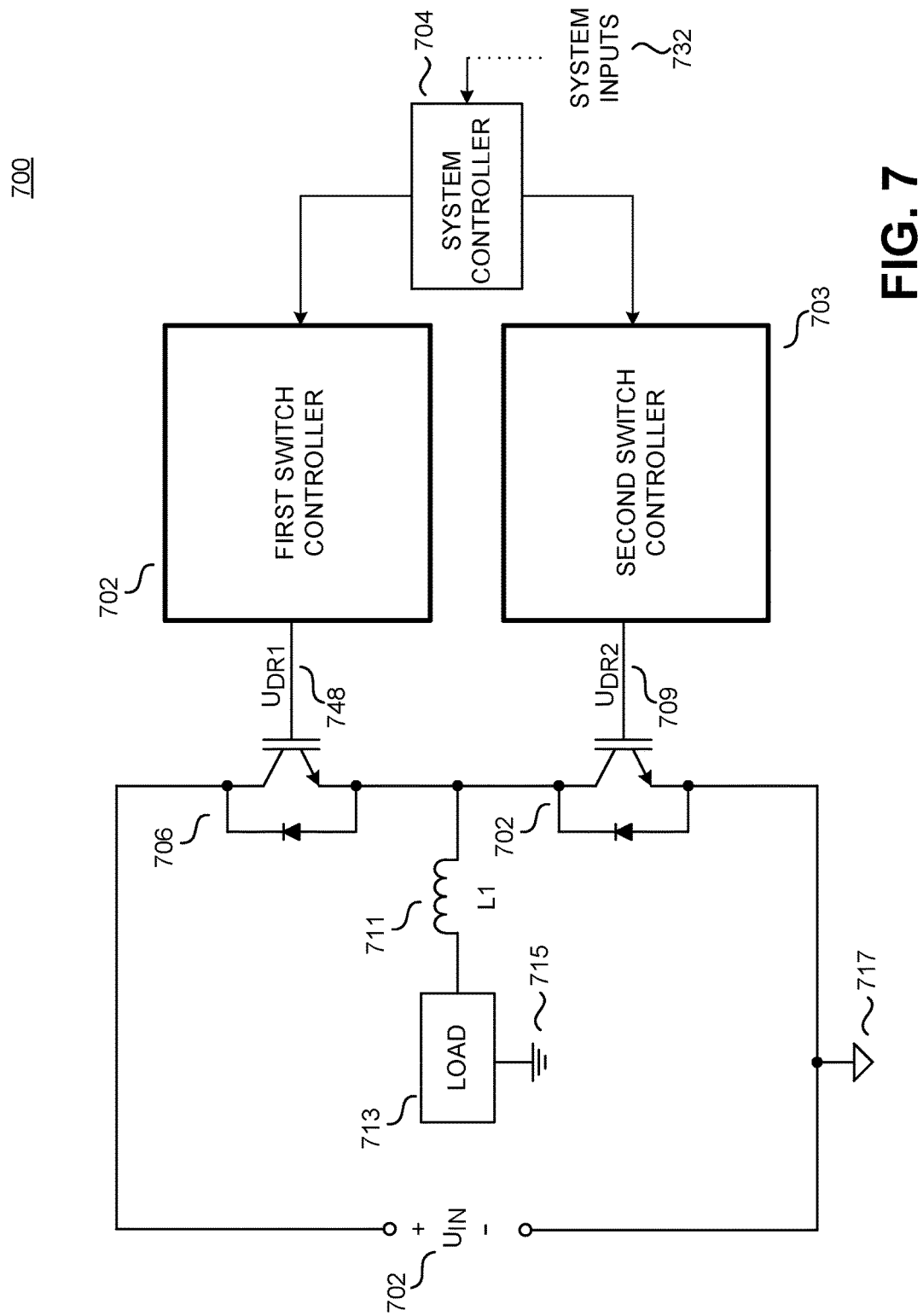
FIG. 7 shows one exemplary system for transferring electrical energy.

FIG. 6C shows an additional logic circuit 688 which may receive the outputs of the comparators 678 and 679 (control signals $U_{ON}$ and $U_{OFF}$) and the drive signal 648 ($U_{DR}$) and outputs an additional drive signal 689 ($U_{DR*}$). The logic circuit 688 may add an additional option to pass any pulse to the semiconductor switch to avoid delays in a noise (disturbance) free environment.

In the examples in FIGS. 6A to 6C, the control signals received on the secondary winding 616 are converted into first and second validation signals 647, 649 by the integration circuits 680, 681 and the validity of a received control signal is identified on the basis of the validation signals 647, 649. In addition, the control signals (such as signals 643, 645 ($U_1$, $U_2$) received on the secondary winding 616 can also be forwarded to a driver circuit without passing through the validation circuit. In this case, the validity of the control signals can be checked more simply in a further circuit. By way of example, a control signal can be declared to be valid if it exceeds a certain pulse length. In one example, a validation signal of a validation circuit and an output signal of the further circuit can be logically combined in a logic circuit by means of an "OR" function. In this case, a semiconductor switch can be switched if at least one of the validation circuit and the further circuit declare a control signal to be valid. In this way, it may be possible to avoid delays as a result of the validation circuit. In one example, the OR gate which performs the "OR" function may receive the signal 643 ($U_1$) and the drive signal 648 ($U_{DR}$) to output the additional drive signal 689 ($U_{DR*}$) to turn on the semiconductor switch. In a further example, another OR gate may receive the signal 645 ($U_2$) and the drive signal 648 ($U_{DR}$) to output the additional drive signal 689 ($U_{DR*}$) to turn off the semiconductor switch.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A switch controller for controlling a power switch, comprising:
   a signal transformer that is coupled to galvanically isolate a primary side of the switch controller from a secondary side of the switch controller and further coupled to receive and transfer a transition signal representative of transitioning the power switch to an on state or to an off state between the primary side and the secondary side, wherein the transition signal pulses to a first value to indicate the power switch transitions to the on state, pulses to a second value to indicate the power switch transitions to the off state, and remains at a third value when there is no transition and a substantially low impendence is switched onto a primary winding of the signal transformer, wherein a length of time for the pulses is a signal duration; and
   a receiver circuit coupled to a secondary winding of the signal transformer, wherein the receiver circuit receives the transition signal and generates a drive signal to control the power switch in response to the transition signal, wherein the receiver circuit further comprises:
   a validation circuit coupled to validate the received transition signal, wherein the validation circuit comprises:

a first comparator to compare a magnitude of the received transition signal with a magnitude threshold;
a timer to time a duration that the magnitude of the received transition signal exceeds the magnitude threshold; and
a second comparator to compare the timed duration with a threshold duration; and
a drive signal generator coupled to generate the drive signal in response to the validation circuit indicating that the received transition signal is valid, wherein the received transition signal is valid when the timed duration exceeds the threshold duration.

2. The switch controller of claim 1, wherein the first value and the second value have substantially the same magnitude but opposite polarity.

3. The switch controller of claim 1, wherein the third value is substantially zero.

4. The switch controller of claim 1, wherein the transmission circuit further controls the switch such that a voltage across the primary winding of the signal transformer is substantially zero when the transition signal indicates there is no transition.

5. The switch controller of claim 1, wherein the primary winding and the secondary winding are wound around the signal transformer, wherein the primary winding partially or fully covers the secondary winding.

6. The switch controller of claim 1, wherein the threshold duration is less than the signal duration.

7. The switch controller of claim 6, wherein the threshold duration is greater than 20% of the signal duration.

8. The switch controller of claim 6, wherein the threshold duration is greater than 40% of the signal duration.

9. The switch controller of claim 6, wherein the signal duration minus the threshold duration is less than 100 nanoseconds.

10. The switch controller of claim 6, wherein the signal duration minus the threshold duration is less than 50 nanoseconds.

11. The switch controller of claim 6, wherein the signal duration minus the threshold duration is less than 30 nanoseconds.

12. The switch controller of claim 1, wherein the timer comprises:
a capacitor;
a current source to charge the capacitor when the magnitude of the received transition signal exceeds the magnitude threshold; and
a current sink to discharge the capacitor when the magnitude of the received transition signal does not exceed the magnitude threshold.

13. The switch controller of claim 1, wherein the relatively low impedance is a short circuit.

14. The switch controller of claim 1, wherein the relatively low impedance is a voltage source blocked by a bypass capacitor.

15. The switch controller of claim 1, wherein the relatively low impedance is a capacitor in series with the winding.

16. The switch controller of claim 1, wherein the power switch comprises an insulated gate bipolar transistor to transition between an off and on states in a time greater than 100 nanoseconds.

17. The switch controller of claim 1, wherein the power switch comprises an insulated gate bipolar transistor to transition between an off and on states in a transition time, the transition time being greater than the measurement period of time.

18. The switch controller of claim 1, further comprising:
a transmission circuit coupled to the primary winding of the signal transformer, wherein the transmission circuit is coupled to control a switch to generate the transition signal, wherein the switch switches the substantially low impedance onto the primary winding when the transition signal indicates there is no transition.

19. A switch controller for controlling a power switch, comprising:
a signal transformer that is coupled to galvanically isolate a primary side of the switch controller from a secondary side of the switch controller and further coupled to receive and a transition signal representative of transitioning the power switch to an on state or to an off state between the primary side and the secondary side, wherein the transition signal pulses to a first value to indicate the power switch transitions to the on state, pulses to a second value to indicate the power switch transitions to the off state, and remains at a third value when there is no transition;
a transmission circuit coupled to a primary winding of the signal transformer, wherein the transmission circuit is coupled to generate the transition signal, wherein the transmission circuit further applies a substantially low impedance onto the primary winding when the transition signal indicates there is no transition; and
a receiver circuit coupled to a secondary winding of the signal transformer, wherein the receiver circuit receives the transition signal and generates a drive signal to control the power switch in response to the transition signal, wherein the receiver circuit further comprises:
a validation circuit coupled to validate the received transition signal, wherein the validation circuit comprises:
a first comparator to compare a magnitude of the received transition signal with a magnitude threshold;
a timer to time a duration that the magnitude of the received transition signal exceeds the magnitude threshold; and
a second comparator to compare the timed duration with a threshold duration.

20. The switch controller of claim 19, wherein the relatively low impedance is a short circuit.

21. The switch controller of claim 19, wherein the power switch comprises an insulated gate bipolar transistor to transition between an off and on states in a time greater than 100 nanoseconds.

22. The switch controller of claim 19, wherein the primary winding and the secondary winding are wound around the signal transformer, wherein the primary winding partially or fully covers the secondary winding.

23. The switch controller of claim 19, wherein the first value and the second value have substantially the same magnitude but opposite polarity.

24. The switch controller of claim 19, wherein the third value is substantially zero.

25. The switch controller of claim 19, wherein the receiver circuit further comprises:
a drive signal generator coupled to generate the drive signal in response to the validation circuit indicating that the received transition signal is valid, wherein the received transition signal is valid when the timed duration exceeds the threshold duration.

26. The switch controller of claim 19, wherein the timer comprises:
 a capacitor;
 a current source to charge the capacitor when the magnitude of the received transition signal exceeds the magnitude threshold; and
 a current sink to discharge the capacitor when the magnitude of the received transition signal does not exceed the magnitude threshold.

* * * * *